(12) United States Patent
Hashim

(10) Patent No.: US 8,047,879 B2
(45) Date of Patent: Nov. 1, 2011

(54) PRINTED WIRING BOARDS AND COMMUNICATION CONNECTORS HAVING SERIES INDUCTOR-CAPACITOR CROSSTALK COMPENSATION CIRCUITS THAT SHARE A COMMON INDUCTOR

(75) Inventor: Amid Hashim, Plano, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 462 days.

(21) Appl. No.: 12/359,453

(22) Filed: Jan. 26, 2009

(65) Prior Publication Data

US 2010/0190357 A1    Jul. 29, 2010

(51) Int. Cl.
   *H01R 24/00*   (2011.01)
(52) U.S. Cl. ........................................ 439/676; 439/404
(58) Field of Classification Search .................. 174/254, 174/255; 361/794, 795, 782; 439/404, 676, 439/55
   See application file for complete search history.

(56) References Cited

U.S. PATENT DOCUMENTS

| | | | |
|---|---|---|---|
| 5,396,397 A | 3/1995 | McClanahan et al. |
| 5,700,167 A | 12/1997 | Pharney et al. |
| 5,915,989 A | 6/1999 | Adriaenssens et al. |
| 5,997,358 A | 12/1999 | Adriaenssens et al. |
| 6,042,427 A | 3/2000 | Adriaenssens et al. |
| 6,050,843 A | 4/2000 | Adriaenssens et al. |
| 6,057,743 A | 5/2000 | Aekins |
| 6,089,923 A | 7/2000 | Phommachanh |
| 6,168,474 B1 | 1/2001 | German et al. |
| 6,215,372 B1 | 4/2001 | Novak |
| 6,270,381 B1 | 8/2001 | Adriaenssens et al. |
| 6,353,540 B1 | 3/2002 | Akiba et al. |
| 6,379,157 B1 | 4/2002 | Curry et al. |
| 6,441,314 B2 | 8/2002 | Rokugawa et al. |
| 6,483,715 B1 | 11/2002 | Chen |
| 6,509,779 B2 | 1/2003 | Yue et al. |

(Continued)

FOREIGN PATENT DOCUMENTS

EP    1 059 702 A2    12/2000

(Continued)

OTHER PUBLICATIONS

Ragu Natarajan and J.P. Dougherty, "Material Compatibility and Dielectric Properties of Co-fired High and Low Dielectric Constant Ceramic Packages," IEEE 1997 Electronic Components and Technology Conference.

(Continued)

*Primary Examiner* — Michael Zarroli
(74) *Attorney, Agent, or Firm* — Myers Bigel Sibley & Sajovec

(57) ABSTRACT

Printed wiring boards for communications connectors are provided that include a mounting substrate having at least first through third input terminals and first through third output terminals. A first conductive path connects the first input terminal to the first output terminal, a second conductive path connects the second input terminal to the second output terminal and a third conductive path connects the third input terminal to the third output terminal. A first inductor and a first capacitor are coupled between the first conductive path and the second conductive path, where the first inductor and the first capacitor are arranged in series to provide a first series inductor-capacitor circuit. A second capacitor is coupled between the third conductive path and the second conductive path through the first inductor to provide a second series inductor-capacitor circuit that shares the inductor of the first series inductor-capacitor circuit. Communications connectors that include such wiring boards or equivalent structures are also provided.

20 Claims, 15 Drawing Sheets

U.S. PATENT DOCUMENTS

| | | |
|---|---|---|
| 6,528,145 B1 | 3/2003 | Berger et al. |
| 6,533,618 B1 | 3/2003 | Aekins |
| 6,538,210 B2 | 3/2003 | Sugaya et al. |
| 6,563,058 B2 | 5/2003 | Mizutani et al. |
| 6,603,668 B2 | 8/2003 | Iwanami |
| 6,663,946 B2 | 12/2003 | Seri et al. |
| 6,678,144 B2 | 1/2004 | Higashi et al. |
| RE38,519 E | 5/2004 | Doorhy et al. |
| 6,734,542 B2 | 5/2004 | Nakatani et al. |
| 6,799,989 B2 | 10/2004 | Doorhy et al. |
| 6,865,090 B2 | 3/2005 | Wajima et al. |
| 6,923,673 B2 | 8/2005 | Doorhy et al. |
| 6,972,893 B2 | 12/2005 | Chen et al. |
| 6,984,886 B2 | 1/2006 | Ahn et al. |
| 7,114,985 B2 | 10/2006 | Doorhy et al. |
| 7,153,168 B2 | 12/2006 | Caveney et al. |
| 7,179,131 B2 | 2/2007 | Caveney et al. |
| 7,182,649 B2 | 2/2007 | Caveney et al. |
| 7,190,594 B2 | 3/2007 | Hashim et al. |
| 7,252,554 B2 | 8/2007 | Caveney et al. |
| 7,265,300 B2 | 9/2007 | Adriaenssens et al. |
| 7,309,261 B2 | 12/2007 | Caveney et al. |
| 7,410,367 B2 | 8/2008 | Hashim et al. |
| 2001/0048592 A1 | 12/2001 | Ninomiya |
| 2002/0088977 A1 | 7/2002 | Mori et al. |
| 2002/0195270 A1 | 12/2002 | Okubora et al. |
| 2003/0024732 A1 | 2/2003 | Ninomiya |
| 2003/0075356 A1 | 4/2003 | Horie |
| 2003/0174484 A1 | 9/2003 | Pai et al. |
| 2003/0218870 A1 | 11/2003 | Fisher et al. |
| 2004/0040740 A1 | 3/2004 | Nakatani et al. |
| 2004/0147165 A1 | 7/2004 | Celella et al. |
| 2004/0184247 A1 | 9/2004 | Adriaenssens et al. |
| 2005/0199422 A1 | 9/2005 | Hashim et al. |
| 2005/0254223 A1 | 11/2005 | Hashim et al. |

FOREIGN PATENT DOCUMENTS

| | | |
|---|---|---|
| WO | WO 03/019734 A1 | 3/2003 |

OTHER PUBLICATIONS

Gary D. Alley, "Interdigital Capacitors and Their Application to Lumped-Element Microwave Integrated Circuits," IEEE Transactions on Microwave Theory and Techniques, 1970, vol. 18, No. 12, p. 1028-1033.

International Search Report and Written Opinion for PCT/US2009/069635, dated Mar. 18, 2010.

PRINTED WIRING BOARDS AND COMMUNICATION CONNECTORS HAVING SERIES INDUCTOR-CAPACITOR CROSSTALK COMPENSATION CIRCUITS THAT SHARE A COMMON INDUCTOR

FIELD OF THE INVENTION

The present invention generally relates to communications connectors and, more particularly, to communications connectors that include crosstalk compensation circuits.

BACKGROUND

In an electrical communications system, it is sometimes advantageous to transmit information signals (e.g., video, audio, data) over a pair of conductors (hereinafter "conductor pair" or "differential pair") rather than over a single conductor. The conductors may comprise, for example, wires, contacts, wiring board traces, conductive vias, other electrically conductive elements and/or combinations thereof. The signals transmitted on each conductor of the differential pair have equal magnitudes, but opposite phases, and the information signal is embedded as the voltage difference between the signals carried on the two conductors. This transmission technique is generally referred to as "balanced" transmission.

When a signal is transmitted over a conductor, electrical noise from external sources such as lightning, electronic equipment, radio stations, etc. may be picked up by the conductor, degrading the quality of the signal carried by the conductor. With balanced transmission techniques, each conductor in a differential pair often picks up approximately the same amount of noise from these external sources. Because approximately an equal amount of noise is added to the signals carried by both conductors of the differential pair, the information signal is typically not disturbed, as the information signal is extracted by taking the difference of the signals carried on the two conductors of the differential pair, and thus the noise signal may be substantially cancelled out by the subtraction process.

Many communications systems include a plurality of differential pairs. For example, a high speed communications system that is used to connect computers and other devices to local area networks and/or to external networks such as the Internet will typically include four differential pairs. In such a system, channels are formed by cascading plugs, jacks and cable segments. In these channels, when a plug mates with a jack, the proximities and routings of the conductors and contacting structures within the jack and/or plug can produce capacitive and/or inductive couplings. Moreover, in the cable segments of these channels, four differential pairs are usually bundled together within a single cable, and thus additional capacitive and/or inductive coupling may occur between the differential pairs in each cable. These capacitive and inductive couplings give rise to another type of noise that is called "crosstalk."

"Crosstalk" in a communication system refers to an unwanted signal that appears on the conductors of an "idle" or "victim" differential pair that is induced by a disturbing differential pair. "Crosstalk" includes both near-end crosstalk, or "NEXT", which is the crosstalk measured at an input location corresponding to a source at the same location (i.e., crosstalk whose induced voltage signal travels in an opposite direction to that of an originating, disturbing signal in a different path), as well as far-end crosstalk, or "FEXT", which is the crosstalk measured at the output location corresponding to a source at the input location (i.e., crosstalk whose signal travels in the same direction as the disturbing signal in the different path). Both NEXT and FEXT are undesirable signals that interfere with the information signal.

A variety of techniques may be used to reduce crosstalk in communications systems such as, for example, tightly twisting the paired conductors (which are typically insulated copper wires) in a cable, whereby different pairs are twisted at different rates that are not harmonically related, so that each conductor in the cable picks up approximately equal amounts of signal energy from the two conductors of each of the other differential pairs included in the cable. If this condition can be maintained, then the crosstalk noise may be significantly reduced, as the conductors of each differential pair carry equal magnitude, but opposite phase signals such that the crosstalk added by the two conductors of a differential pair onto the other conductors in the cable tends to cancel out.

While such twisting of the conductors and/or various other known techniques may substantially reduce crosstalk in cables, most communications systems include both cables and communications connectors (i.e., jacks and plugs) that interconnect the cables and/or connect the cables to computer hardware. Unfortunately, the jack and plug configurations that were adopted years ago generally did not maintain the conductors of each differential pair a uniform distance from the conductors of the other differential pairs in the connector hardware. Moreover, in order to maintain backward compatibility with connector hardware that is already installed, the connector configurations have, for the most part, not been changed. As such, the conductors of each differential pair tend to induce unequal amounts of crosstalk on each of the other conductor pairs in current and pre-existing connectors. As a result, many current connector designs generally introduce some amount of NEXT and FEXT crosstalk.

Pursuant to certain industry standards (e.g., the TIA/EIA-568-B.2-1 standard approved Jun. 20, 2002 by the Telecommunications Industry Association), each jack, plug and cable segment in a communications system may include a total of eight conductors 1-8 that comprise four differential pairs. By convention, the conductors of each differential pair are often referred to as a "tip" conductor and a "ring" conductor. The industry standards specify that, in at least the connection region where the contacts (blades) of a modular plug mate with the contacts of the modular jack (i.e., the plug-jack mating region), the eight conductors are generally aligned in a row, with the four differential pairs specified as depicted in FIG. 1. As known to those of skill in the art, under the TIA/EIA 568, type B configuration, conductor 5 in FIG. 1 comprises the tip conductor of pair 1, conductor 4 comprises the ring conductor of pair 1, conductor 1 comprises the tip conductor of pair 2, conductor 2 comprises the ring conductor of pair 2, conductor 3 comprises the tip conductor of pair 3, conductor 6 comprises the ring conductor of pair 3, conductor 7 comprises the tip conductor of pair 4, and conductor 8 comprises the ring conductor of pair 4.

As shown in FIG. 1, in the connection region where the contacts (blades) of a modular plug mate with the contacts of the modular jack, the conductors of the differential pairs are not equidistant from the conductors of the other differential pairs. By way of example, conductor 2 (i.e., the ring conductor of pair 2) is closer to conductor 3 (i.e., the tip conductor of pair 3) than is conductor 1 (i.e., the tip conductor of pair 2) to conductor 3. Consequently, differential capacitive and/or inductive coupling occurs between the conductors of pairs 2 and 3 that generate both NEXT and FEXT. Similar differential coupling occurs with respect to the other differential pairs in the modular plug and the modular jack.

U.S. Pat. No. 5,997,358 to Adriaenssens et al. (hereinafter "the '358 patent") describes multi-stage crosstalk compensating schemes for plug-jack combinations. The entire contents of the '358 patent are hereby incorporated herein by reference as if set forth fully herein. The connectors described in the '358 patent can reduce the "offending" crosstalk that may be induced from the conductors of a first differential pair onto the conductors of a second differential pair in, for example, the plug-jack mating region where the blades of a modular plug mate with the contacts of a modular jack. Pursuant to the teachings of the '358 patent, a "compensating" crosstalk may be deliberately added, usually in the jack, that reduces or substantially cancels the offending crosstalk at the frequencies of interest. The compensating crosstalk can be designed into the lead frame wires of the jack and/or into a printed wiring board that is electrically connected to the lead frame within the jack. As discussed in the '358 patent, two or more stages of crosstalk compensation may be provided, where the magnitude and phase of the compensating crosstalk signal induced by each stage, when combined with the compensating crosstalk signals from the other stages, provide a composite compensating crosstalk signal that substantially cancels the offending crosstalk signal over a frequency range of interest. In two stage compensation schemes, the first stage has a polarity that is opposite the polarity of the offending crosstalk, while the second stage has a polarity that is the same as the polarity of the offending crosstalk (note that either or both of the first and second stages may have multiple sub-stages). The multi-stage (i.e., two or more) compensation schemes disclosed in the '358 patent can be more efficient at reducing the NEXT than schemes in which the compensation is added at a single stage, especially when the second and subsequent stages of compensation include a time delay that is selected and/or controlled to account for differences in phase between the offending signal and the first stage compensating crosstalk signal. Efficiency of crosstalk compensation may be increased if the first stage or a portion of the first stage design is contained in the lead frame wires or is otherwise at little or no delay from the plug-jack mating region.

Although extremely effective, the NEXT compensating scheme of the '358 patent suffers a drawback in that the NEXT margin relative to certain performance standards set forth by industry groups such as the Telecommunications Industry Association (TIA) may tend to deteriorate at low frequencies (e.g., below approximately 100 MHz) when a high crosstalk plug is used with the jack (i.e., a plug having crosstalk levels at the high end of the acceptable range specified in the relevant industry standards), and at high frequency (e.g., beyond approximately 250 MHz) when a low crosstalk plug is used with the jack (i.e., a plug having crosstalk levels at the low end of the acceptable range specified in the relevant industry standards). In particular, when the net compensation crosstalk in a two-stage compensated jack is less than the original crosstalk (i.e. when a high crosstalk plug is inserted into the jack), the plug-jack combination is said to be undercompensated, and the resultant NEXT frequency characteristic builds up to a peak that causes NEXT marginality at low frequencies before a null sets in at a frequency point determined by the inter-stage delays and the magnitudes of the compensating stages.

On the other hand, when the net compensation crosstalk in such a jack is more than the original crosstalk (i.e. when a low crosstalk plug is inserted), the plug-jack combination is said to be over-compensated, and the resultant NEXT frequency characteristic does not have a null, but the slope of the NEXT frequency characteristic gradually increases, tending towards as much as 60 dB/decade at very high frequencies, and thereby exceeding the TIA limit slope of 20 dB/decade.

Thus, while the low frequency performance of a jack can be improved by increasing the "composite" crosstalk compensation level (i.e., the sum of the crosstalk provided by each stage of a multi-stage crosstalk compensation circuit) when a high crosstalk plug is used with the jack, such an action would lead to further deterioration of the high frequency performance of the jack when a low crosstalk plug is used with the jack. Conversely, while the high frequency performance of a jack can be improved by decreasing the composite crosstalk compensation level when a low crosstalk plug is used with the jack, such an action would lead to further deterioration of the low frequency performance of the jack when a high crosstalk plug is used with the jack.

U.S. Pat. No. 7,190,594 to Hashim et al. ("the '594 patent"), which is assigned to the assignee of the present application, discloses communication connectors for simultaneously improving both the high frequency NEXT performance when a low crosstalk plug is used in the connectors and the low frequency NEXT performance when a high crosstalk plug is used. In particular, the '594 patent describes communications connectors which include series inductor-capacitor circuits in which the resultant capacitive coupling is biased so as to reduce the normalized composite crosstalk compensation level with increasing frequency, thereby providing improved high frequency performance without degrading the low frequency performance of the connector.

SUMMARY

Pursuant to embodiments of the present invention, printed wiring boards for communications connectors are provided that include a mounting substrate having at least first through third input terminals and first through third output terminals. A first conductive path connects the first input terminal to the first output terminal, a second conductive path connects the second input terminal to the second output terminal and a third conductive path connects the third input terminal to the third output terminal. A first inductor and a first capacitor are coupled between the first conductive path and the second conductive path, where the first inductor and the first capacitor are arranged in series to provide a first series inductor-capacitor circuit. A second capacitor is coupled between the third conductive path and the second conductive path through the first inductor.

In some embodiments, the printed wiring board further includes a second inductor that is coupled between the second capacitor and the first inductor. In such embodiments, the second capacitor, the first inductor and the second inductor may form a second series inductor-capacitor circuit. The resonant frequency of at least one of the first and second series inductor-capacitor circuits may be set in the range of about 750 MHz to about 1000 MHz. At least one of the first inductor or the second inductor may be implemented as a conductive trace that is on and/or within the mounting substrate that includes self-coupling segments that are immediately adjacent to each other and that have the same instantaneous current direction. In some embodiments, the self coupling segments may be a portion of the conductive path that has a spiral shape. The capacitance of the first capacitor may exceed a capacitance of the second capacitor by at least fifty percent. The resonant frequency of the first series inductor-capacitor circuit may be within 25% of the resonant frequency of the second series inductor-capacitor circuit.

In some embodiments, the printed wiring board may also include a fourth conductive path that together with the second conductive path forms a differential pair of conductive paths for carrying a differential signal. A crosstalk compensation circuit may also be provided between the first conductive path and the fourth conductive path that generates crosstalk having a first polarity. The first polarity may be generally opposite the polarity of the crosstalk generated by the first series inductor-capacitor circuit.

Pursuant to further embodiments of the present invention, communications connectors are provided that include a plurality of conductive paths, each of which connects a respective one of a plurality of input terminals to a respective one of a plurality of output terminals. Each of the conductive paths is paired with another of the conductive paths, and each pair of conductive paths is configured to transmit a differential signal through the connector. A first capacitor and a first inductor are coupled in series between a first conductive path of a first of the differential pairs and a first conductive path of a second of the differential pairs to provide a first series inductor-capacitor circuit between these conductive paths. A second capacitor is coupled between a first conductive path of a third of the differential pairs and a first node that is located between the first capacitor and the first inductor to provide a second series inductor-capacitor circuit between the first conductive path of the third of the differential pairs and the first conductive path of the second of the differential pairs.

In some embodiments, the connector further includes a second inductor that is disposed in series between the second capacitor and the first node that is part of the second series inductor-capacitor circuit. The connector may also include a crosstalk compensation circuit between the first of the differential pairs and the third of the differential pairs that is designed to at least partly compensate for crosstalk that passes between the first of the differential pairs and the third of the differential pairs via the first capacitor, the second capacitor and the second inductor. In some embodiments, the communications connector may be a communications jack, where the conductive paths are aligned in a generally side-by-side array in a plug-jack mating region of the connector, and where one of the conductive paths of the third differential pair is on the outside of the array in the plug-jack mating region.

DETAILED DESCRIPTION

Figure 1:
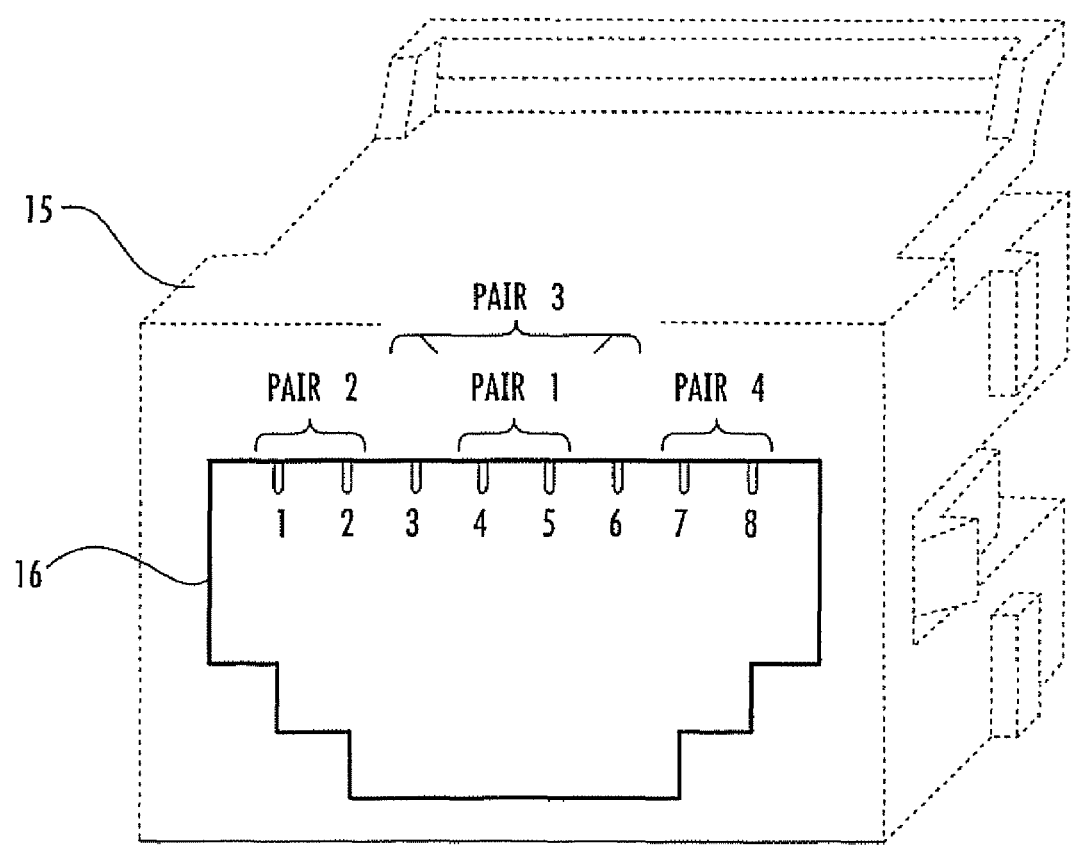
FIG. 1 is a schematic diagram illustrating the modular jack contact wiring assignments for a conventional 8-position communications jack (TIA 568B) as viewed from the front opening of the jack.

The present invention is described more particularly hereinafter with reference to the accompanying drawings. The invention is not intended to be limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

Unless otherwise defined, all technical and scientific terms used herein have the same meaning as commonly understood by one of ordinary skill in the art to which this invention belongs. The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. As used herein, the term "and/or" includes any and all combinations of one or more of the associated listed items.

As used herein, the terms "attached" or "connected" can mean either a direct or an indirect attachment or connection between elements. In contrast, the terms "directly attached" and "directly connected" refer to a direct attachment and direct connection, respectively, without any intervening elements.

Herein, reference is made to "pairs" of conductive paths, conductors, contact wires and the like, The word "pair" is used to indicate that the conductive paths, conductors, contact wires or the like form a differential pair (i.e., a pair of conductors that carry a differential signal), as opposed to indicating that these elements are adjacent to each other or otherwise physically paired.

Pursuant to embodiments of the present invention, communications connectors are provided which exhibit enhanced high frequency NEXT performance between multiple differential pairs. These communications connectors may employ multi-stage compensation techniques to provide improved NEXT performance between two or more pairs of differential pairs within the connector (herein a pair of differential pairs such as, for example, pair 1 and pair 3 of FIG. 1, is also referred to as a "pair combination"). In these connectors, the second crosstalk compensation stage for at least two of the pair combinations may include a series inductor-capacitor circuit that may be used to simultaneously improve, for the pair combinations at issue, both the high frequency NEXT performance when a low crosstalk plug is used in the connector and the low frequency NEXT performance when a high crosstalk plug is used.

As discussed in the aforementioned '594 patent, the high frequency performance of a communications connector that employs multi-stage NEXT compensation can be improved by including a series inductor-capacitor circuit (or other circuits that have an effective capacitance that varies with frequency) in the second compensation stage of the multi-stage NEXT compensation circuit. This effect may occur because the series inductor-capacitor circuit generates increased normalized crosstalk levels with increasing frequency (the "normalized" crosstalk level refers to the crosstalk level that has been normalized so as to be independent of the 20 dB/decade increase with frequency that occurs if a pure capacitor is used). As the second stage of a multi-stage compensation circuit introduces crosstalk having the same polarity as the offending crosstalk, the series inductor-capacitor circuit, when combined with the compensating crosstalk signals from the other stages, provides normalized composite crosstalk compensation levels that decrease with increasing frequency.

As is known to those of skill in the art, the resonant frequency $f_{res}$ of a series inductor-capacitor circuit may be expressed as:

$$f_{res} = \frac{1}{2\pi\sqrt{LC}} \quad (1)$$

where C is the capacitance of the capacitor and L is the inductance of the inductor. As is discussed in the '594 patent, the series inductor-capacitor circuit behaves as a capacitor that has an effective capacitance $C_{eff}$ that is a function of frequency, which may be expressed as:

$$C_{eff} = \frac{C}{1 - (2\pi f)^2 LC} \quad (2)$$

where f is the frequency. Thus, from Equations 1 and 2, it can be seen that the effective capacitance $C_{eff}$ increases with frequency at frequencies that are less than the resonant frequency $f_{res}$ of the series inductor-capacitor circuit. L and C thus may be chosen such that the resonant frequency $f_{res}$ occurs above the highest operating frequency of the bandwidth of interest in order to allow the effective capacitance of the series inductor-capacitor circuit to increase as the frequency increases up to the resonant frequency $f_{res}$. Moreover, as the frequency f increases, the closer it approaches to the resonant frequency $f_{res}$, the greater is the effective capacitance $C_{eff}$ that is provided by the series inductor-capacitor circuit.

While the '594 patent discusses using a series inductor-capacitor circuit to improve the crosstalk performance on a single pair combination within a connector (namely on the pair 1-3 pair combination), in certain situations it may be desirable to use series inductor-capacitor circuits on multiple pair combinations. While such series inductor-capacitor circuits may be used on any pair combination, the use of such circuits may be particularly effective on the pair 1-3, pair 2-3 and pair 3-4 pair combinations (herein the pair 2-3 and pair 3-4 pair combinations are referred to as the "side-pair combinations") of communications connectors that are configured according to the TIA 568B standard. However, given the small size of these connectors, providing series inductor-capacitor circuits for multiple pair combinations can be a challenge. In particular, as discussed in the '594 patent, one convenient and cost-effective way of implementing the inductor portion of a series inductor-capacitor circuit is by forming a spiral inductor on a printed circuit board of the communications connector. However, as can be seen from FIG. 4B of the '594 patent, such spiral conductors can use a significant amount of real estate on the printed circuit board, and hence implementing series inductor-capacitor circuits on multiple pair combinations can consume an excessive amount of real estate on the printed wiring board.

Moreover, the size of the capacitor that is used in the series inductor-capacitor circuit is typically determined by the design of the multi-stage compensation scheme. Since pair combinations other than the pair 1-3 pair combination of communications connectors that are configured according to the TIA 568B standard typically exhibit significantly lower levels of offending NEXT, the crosstalk compensation circuits for such pair combinations will typically include smaller reactive elements. As a result, in order to set the resonant frequency of a series inductor-capacitor circuit of for example, a side-pair combination, in a desired range (which is typically, for example, about 1.1 to about 2.5 times the maximum operating frequency of the connector), the inductor of the series inductor-capacitor circuit may require a large inductance value. This increased inductance would typically be provided by increasing the physical size of the inductor, thereby further aggravating any constraints on available printed wiring board real estate.

As a result of these printed wiring board real estate constraints, it can be difficult to implement series inductor-capacitor circuits on multiple pair combinations in certain communications connectors. Pursuant to embodiments of the present invention, techniques are disclosed for sharing an inductor between multiple series inductor-capacitor circuits in order to reduce the overall amount of printed wiring board real estate required to implement series inductor-capacitor circuits having resonance frequencies within a desired range on multiple pair combinations within a communications connector.

Figure 2:
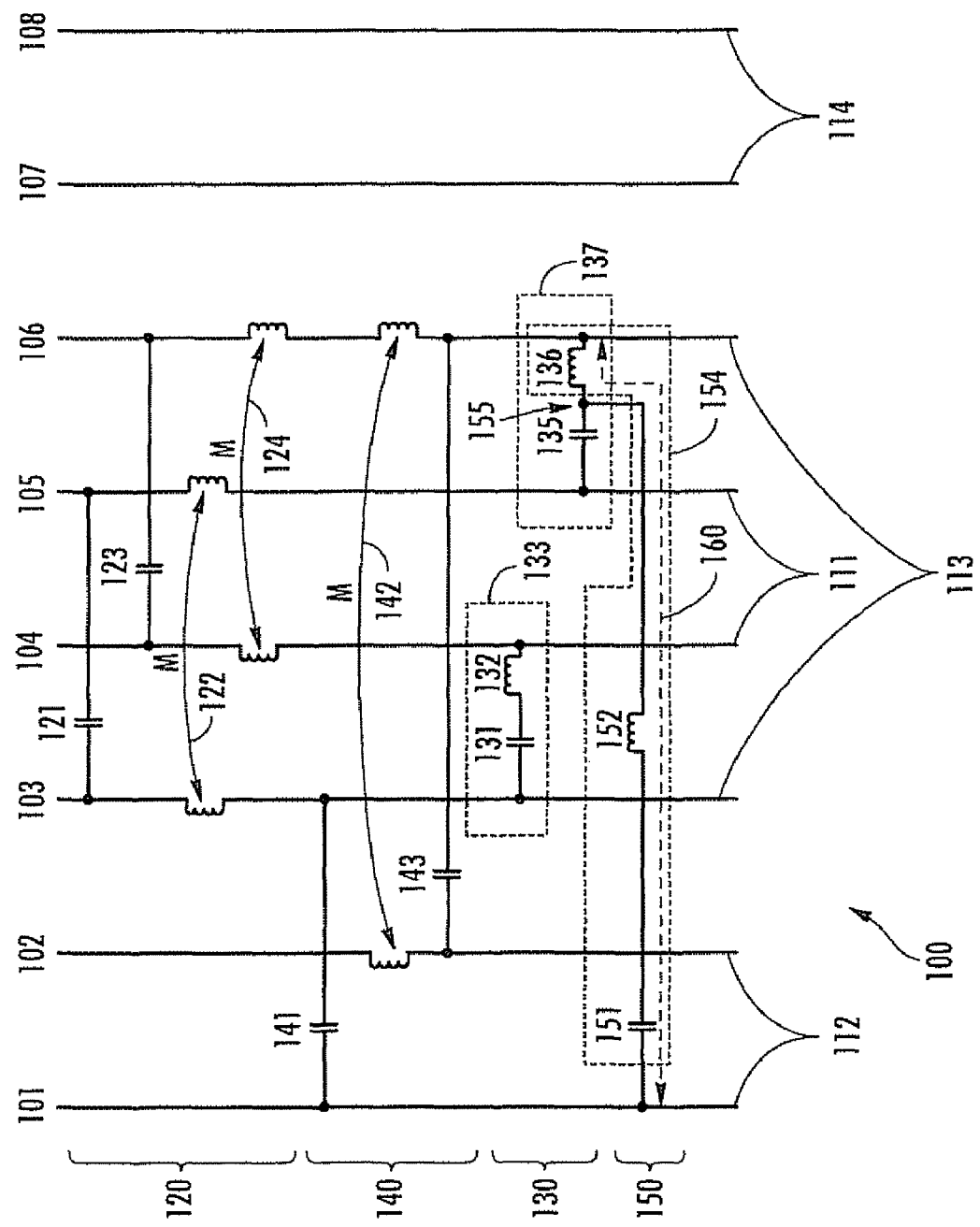
FIG. 2 is a schematic circuit diagram of a communications connector according to embodiments of the present invention which uses a multi-stage compensation scheme that exhibits reduced normalized composite crosstalk compensation with increasing frequency.

FIG. 2 is a schematic circuit diagram of a communications connector 100 (or of a printed wiring board thereof) according to embodiments of the present invention which uses a multi-stage compensation scheme that may exhibit reduced normalized composite crosstalk compensation with increasing frequency on multiple pair combinations. As noted above, this is achieved by sharing an inductor between multiple series inductor-capacitor circuits. In the particular example of FIG. 2, the multi-stage compensation scheme is being applied to a communications connector 100 that includes eight conductive paths 101-108 that are arranged as if four differential pairs of conductive paths 111-114. As is apparent from FIG. 2, the differential pairs 111-114 are arranged pursuant to the TIA/EIA 568 type B wiring configuration that is discussed above with respect to FIG. 1, with pair 111 corresponding to pair 1, pair 112 corresponding to pair 2, pair 113 corresponding to pair 3, and pair 114 corresponding to pair 4. As used herein, the term "conductive path" refers to an electrically conductive path that may include one or more elements such as contact wires, traces on a printed wiring board, metal-plated vias on a printed circuit board, insulation displacement contacts, etc.

As shown in FIG. 2, the connector 100 employs multi-stage compensation on two different pair combinations. In particular, multi-stage compensation is provided between pairs 111 and 113 and between pairs 112 and 113. The multi-stage compensation between pairs 111 and 113 includes a first stage 120 and a second stage 130. The first stage 120 includes a capacitor 121 that is coupled between conductive paths 103 and 105, a mutual inductor 122 that is coupled between conductive paths 103 and 105, a capacitor 123 that is coupled between conductive paths 104 and 106, and a mutual inductor 124 that is coupled between conductive paths 104 and 106. The second stage 130 comprises a capacitor 131 and an inductor 132. The capacitor 131 and the inductor 132 are arranged in series as a first series inductor-capacitor circuit 133 that is coupled between conductive paths 103 and 104. The second stage 130 further includes a capacitor 135 and an inductor 136. The capacitor 135 and the inductor 136 are arranged in series as a second series inductor-capacitor circuit 137 that is coupled between conductive paths 105 and 106. A node 155 (discussed below) is located between capacitor 135 and inductor 136. The node 155 may comprise, for example, a location on a conductive trace or a metal-plated via of a printed wiring board.

The multi-stage crosstalk compensation circuit between pairs 112 and 113 includes a first stage 140 and a second stage 150. In this particular embodiment, the first stage 140 includes a capacitor 141 that is coupled between conductive paths 101 and 103, a mutual inductor 142 that is coupled between conductive paths 102 and 106, and a capacitor 143 that is coupled between conductive paths 102 and 106. The second stage 150 comprises a capacitor 151, an inductor 152 and the inductor 136. The circuit path 160 which includes the capacitor 151 and the inductors 152 and 136 serves as a third series inductor-capacitor circuit 154 that is coupled between conductive paths 101 and 106. The inductors 152 and 136 are in series with each other and hence effectively operate as one large inductor that has an inductance that is equal to the sum of the inductance of inductors 152 and 136.

As is apparent from FIG. 2, the inductor 136 is part of both the second series capacitor-inductor circuit 137 and the third series inductor-capacitor circuit 154. By "reusing" inductor 136 so that it is part of the series inductor-capacitor circuit 154, the size of the inductor 152 may be correspondingly reduced, thereby decreasing the amount of printed wiring board real estate necessary to implement the first through third series inductor-capacitor circuits 133, 137, 154.

In some embodiments, some or all of the capacitors 121, 123, 131, 135, 141, 143 and/or 151 and some or all of the inductors/mutual inductors 122, 124, 132, 136, 142 and/or 152 of FIG. 2 may be implemented in, and/or mounted on, a printed wiring board such as a standard printed circuit board. This printed wiring board may be mounted at least partially within the connector 100. The conductive paths 101-108 may comprise conductive traces that are printed on one or more layers of the printed wiring board (along with conductive elements that connect trace segments that are on different levels of the printed wiring board). The printed wiring board may include a plurality of input terminals such as, for example, metal plated holes that receive contact wires or contact pads. The printed wiring board may also include a plurality of output terminals such as, for example, metal plated holes that receive wire connection terminals, contact wires or contact pads. Each conductive path may connect a respective one of the input terminals to a respective one of the output terminals.

It will be noted that by connecting one end of the inductor 152 to conductive path 106 though the inductor 136 (i.e., by directly connecting one end of the inductor 152 to the node 155), an additional electrical path is created between conductive paths 101 and 105 (i.e., the path that includes capacitors 135 and 151 and inductor 152). This additional electrical path creates coupling between conductive paths 101 and 105, which, in effect, comprises offending crosstalk between pairs 111 and 112. This offending crosstalk may substantially cancel or reduce to a beneficial level oppositely polarized crosstalk produced by other indirect coupling paths such as, for example, the one created between conductive paths 101 and 104 by capacitors 141 and 131 and inductor 132. Otherwise, this offending crosstalk can be cancelled by providing a crosstalk compensation circuit between pairs 111 and 112 (e.g., a capacitor between conductive paths 101 and 104 and/ or a capacitor between conductive paths 102 and 105). Additionally, if multi-stage compensation is used to provide crosstalk compensation between pairs 111 and 112, this offending crosstalk can be used as the second stage of such a multi-stage compensation circuit. In some embodiments, the amount of coupling between pairs 111 and 112 may be sufficiently small such that no compensation circuit is needed.

It will be appreciated that numerous modifications may be made to the connector 100 of FIG. 2 without departing from the teachings or scope of the present invention. For example, the first stage 140 of crosstalk compensation for the 112-113 pair combination could be implemented in numerous different ways, including eliminating one or more of capacitors 141 and 143 and/or mutual inductor 142, or adding a mutual inductor between conductive paths 101 and 103. Similar changes could be made to the first stage 120 of crosstalk compensation for the 111-113 pair combination. Additionally, it will also be appreciated that the locations of the circuit elements in FIG. 2 (and the similar figures which follow) could also be modified. For example, the capacitor 121 in FIG. 2 could be moved so that the capacitance is added after the mutual inductance added by mutual inductor 122. Thus, it will be understood that the particular arrangements shown in FIG. 2 and the similar figures that follow are exemplary in nature.

It will be appreciated that FIG. 2 illustrates one of many configurations in which series inductor-capacitor circuits may be employed on multiple pair combinations in a communications connector. FIGS. 3-7 below are schematic circuit diagrams of communications connectors according to further embodiments of the present invention which again provide reduced normalized composite crosstalk compensation with increasing frequency on multiple pair combinations.

Figure 3:
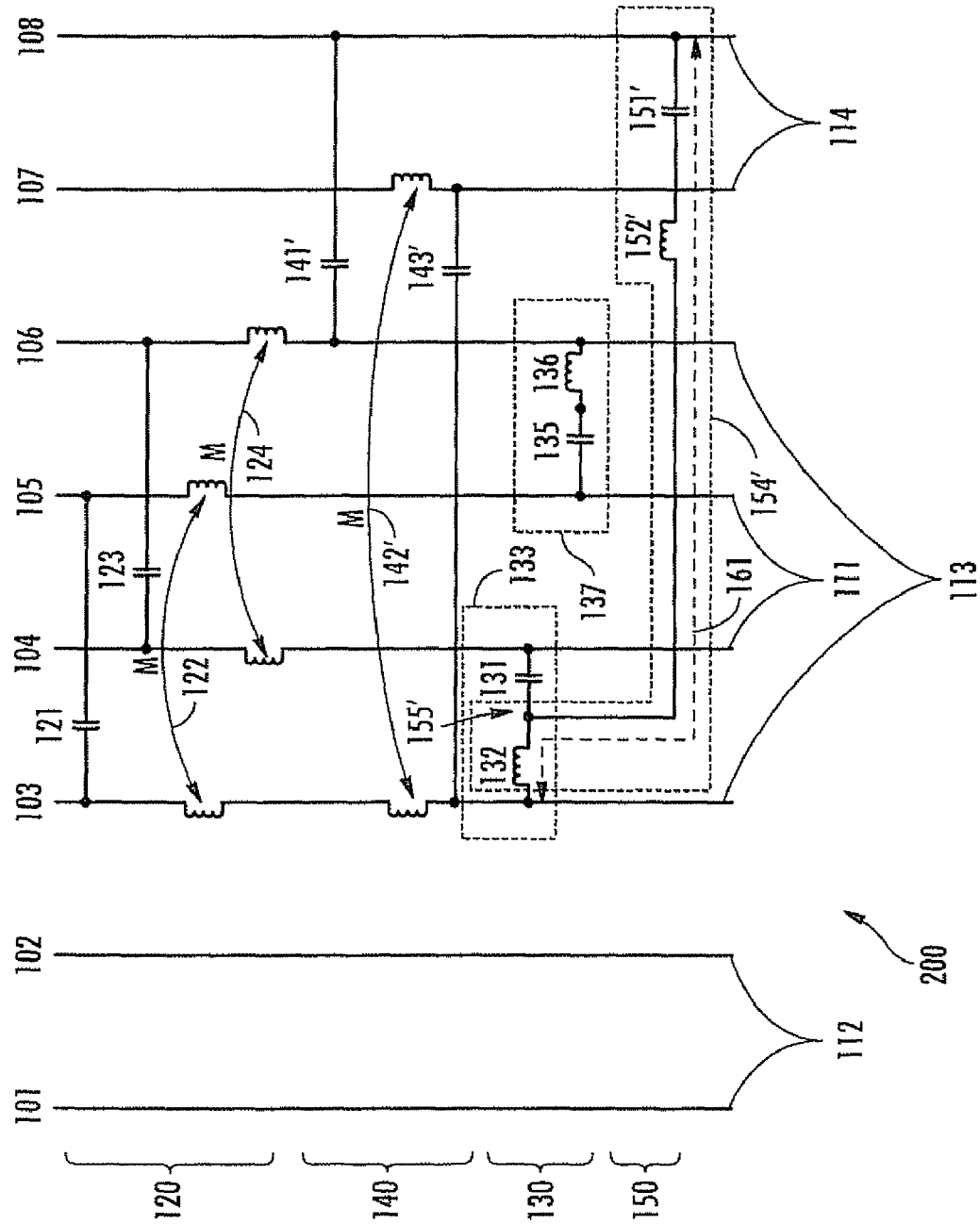
FIG. 3 is a schematic circuit diagram of a communications connector according to further embodiments of the present invention.

In particular, FIG. 3 illustrates a communications connector 200 in which multi-stage compensation circuits that include series inductor-capacitor circuits are implemented on the pair 111-113 and pair 113-114 pair combinations. Connector 200 is identical to the connector 100 that is described above, except that (1) the capacitors 141 and 143 and the mutual inductor 142 that form the first crosstalk compensation stage for the 112-113 pair combination are replaced by the capacitors 141' and 143' and the mutual inductor 142' that form the first crosstalk compensation stage for the 113-114 pair combination, (2) the positions of the capacitor 131 and the inductor 132 that form part of the pair 111-113 pair combination second stage crosstalk compensation circuit 130 are reversed and (3) instead of the circuit path 160, a circuit path 161 is provided that includes inductors 132 and 152' and capacitor 151'. The circuit path 161 extends between conductive path 108 and conductive path 103 through a node 155' that is located between inductor 132 and capacitor 131. Thus, in the connector 200, the inductors 132 and 152' and the capacitor 151' form a series inductor-capacitor circuit 154' that acts as the second compensation stage of a multi-stage crosstalk compensation circuit for the 113-114 pair combination. As the series inductor-capacitor circuit 154' of connector 200 is, in effect, a mirror image of the series inductor-capacitor circuit 154 of connector 100 that is described above, and as the remaining components of connector 200 may be identical or mirror images to the components of connector 100, further discussion of the structure and operation of connector 200 will be omitted.

Figure 4:
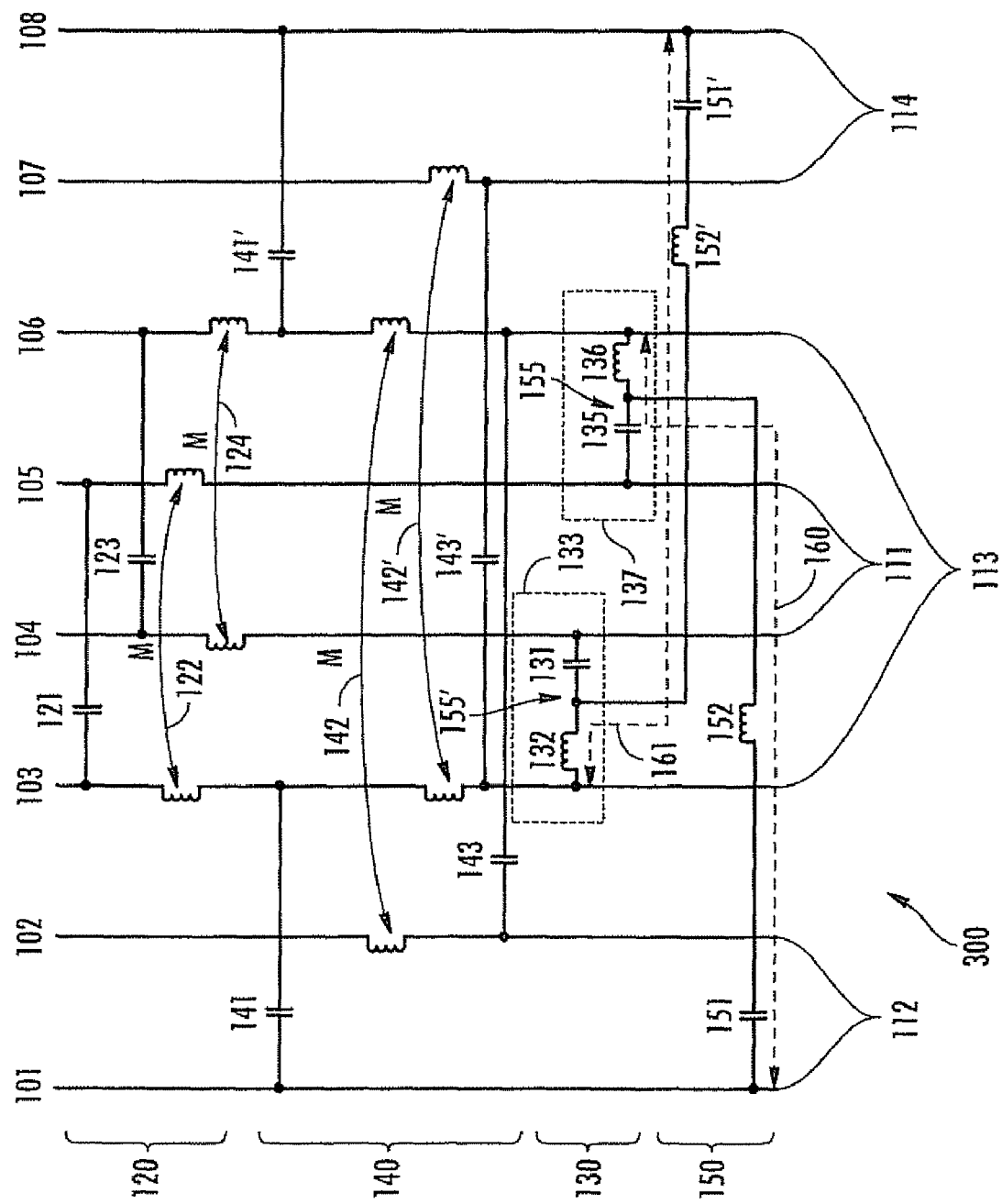
FIG. 4 is a schematic circuit diagram of a communications connector according to additional embodiments of the present invention.

FIG. 4 illustrates a communications connector 300 in which multi-stage compensation circuits that include series inductor-capacitor circuits are implemented on the pair 111-113, pair 112-113 and pair 113-114 pair combinations. The connector 300 is similar to the connectors 100 and 200 described above, except that the connector 300 includes both the circuit path 160 and the circuit path 161. As all of the components of the connector 300 have been discussed above with respect to like-numbered components of connectors 100 and 200, further discussion of the structure and operation of connector 300 will be omitted.

Figure 5:
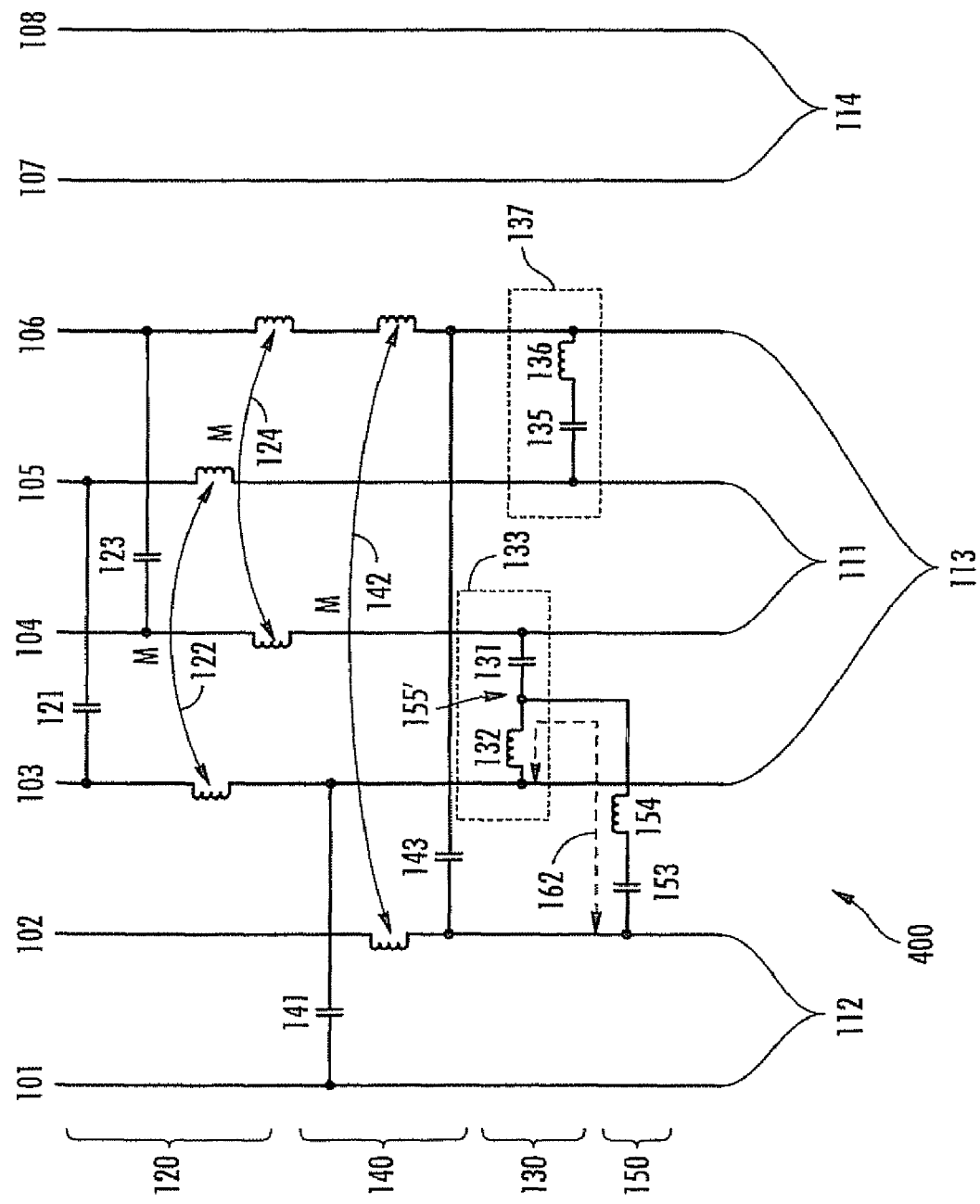
FIG. 5 is a schematic circuit diagram of a communications connector according to still further embodiments of the present invention.

FIG. 5 illustrates a communications connector 400 in which multi-stage compensation circuits that include series inductor-capacitor circuits are implemented on the pair 111-113 and pair 112-113 pair combinations (i.e., on the same pair combinations as connector 100 of FIG. 2). Connector 400 is identical to the connector 100 that is described above, except that the positions of the capacitor 131 and the inductor 132 that form part of the pair 111-113 pair combination second stage crosstalk compensation circuit 130 are reversed, and the circuit path 160 of connector 100 that extends between conductive path 101 and conductive path 106 through the node 155 is replaced with a circuit path 162 that extends between conductive path 102 and conductive path 103 through the node 155'. The circuit path 162 includes a capacitor 153 and an inductor 154 that are arranged in series. As a result of these changes, a series inductor-capacitor second stage crosstalk compensation circuit is provided for the pair 112-113 pair combination that includes the capacitor 153, the inductor 154 and the inductor 132.

Figure 6:
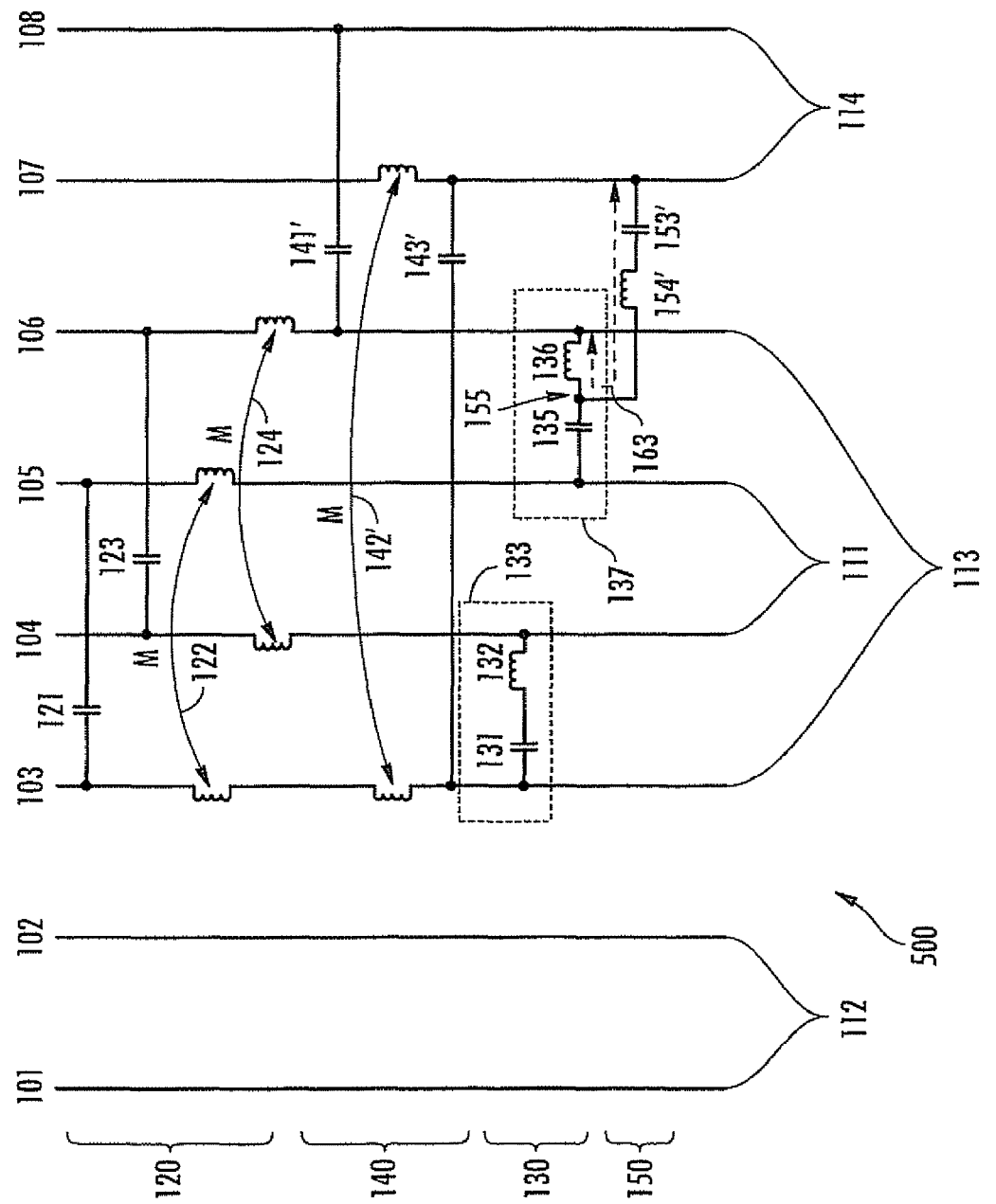
FIG. 6 is a schematic circuit diagram of a communications connector according to other embodiments of the present invention.

FIG. 6 illustrates a communications connector 500 in which multi-stage compensation circuits that include series inductor-capacitor circuits are implemented on the pair 111-113 and pair 113-114 pair combinations (i.e., on the same pair combinations as connector 200 of FIG. 3). Connector 500 is identical to the connector 200 that is described above with respect to FIG. 3, except that the circuit path 161 of connector 200 that extends between conductive path 108 and conductive path 103 is replaced with a circuit path 163 that extends between conductive path 107 and conductive path 106. The circuit path 163 includes a capacitor 153' and an inductor 154' that are arranged in series. As a result of these changes, a series inductor-capacitor second stage crosstalk compensation circuit is provided for the pair 113-114 pair combination that includes the capacitor 153', the inductor 154' and the inductor 136.

Figure 7:
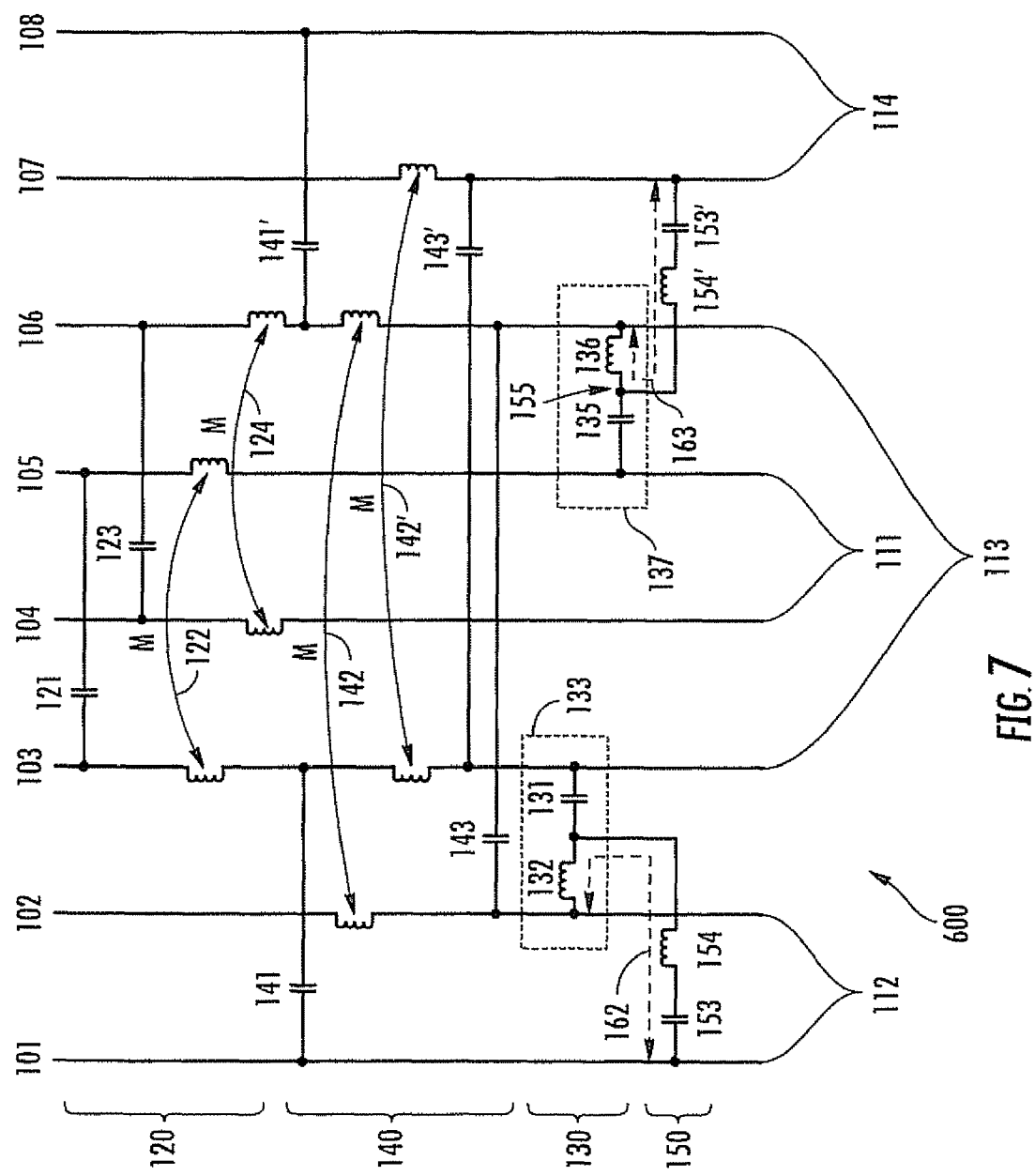
FIG. 7 is a schematic circuit diagram of a communications connector according to still other embodiments of the present invention.

FIG. 7 illustrates a communications connector 600 in which multi-stage compensation circuits that include series inductor-capacitor circuits are implemented on the pair 111-113, pair 112-113 and pair 113-114 pair combinations. The connector 600 is similar to the connectors 400 and 500 described above, except that the connector 600 includes both the circuit path 162 and the circuit path 163. As all of the components of the connector 600 have been discussed above with respect to like-numbered components of connectors 400 and 500, further discussion of the structure and operation of connector 600 will be omitted.

It will also be appreciated that additional variations are possible. For example, a connector in which multi-stage compensation circuits that include series inductor-capacitor circuits are implemented on the pair 111-113, pair 112-113 and pair 113-114 pair combinations could be formed by replacing the circuit path 161 in connector 300 with the circuit path 163 of connector 500. In yet another embodiment, the connector 100 of FIG. 2 could be modified to swap the locations of inductor 152 and capacitor 151. Similar changes could be made to each of the above described embodiments. Thus, it will be appreciated that the above embodiments are exemplary in nature only.

Likewise, it will be appreciated that the series inductor-capacitor circuits that share a common inductor that are disclosed herein can be used on other pair combinations of the connector such as, for example, the pair 111-113 and pair 111-112 pair combinations or with communications connectors that include more or less than four differential pairs. Moreover, the disclosed series inductor-capacitor circuits may be used in any type of communications connector, specifically including jacks, plugs and connecting blocks. Thus, while FIGS. 9-10 below describe in detail one exemplary embodiment of the present invention that is implemented in a communications jack, it will be appreciated that the same techniques may be used in, for example, communications plugs and/or connecting blocks without departing from the scope of the present invention.

It should be noted that the series inductor-capacitor circuits disclosed herein do not provide a direct (i.e., time invariant) current path between two conductive paths. By way of example, referring to connector 100 of FIG. 2, the circuit path 160 includes the capacitor 151, and thus the only signal energy that travels from conductive path 101 to conductive path 106 (and vice versa) via the circuit path 160 is the energy that is transferred across the capacitor 151. Despite this, it will be understood that some level of time varying current will flow through the circuit path 160 (as well as, for example, the circuit paths 161-163). Thus, an inductor that is included in any of the series inductor-capacitor circuits that are disclosed herein can be implemented, in some embodiments, as a circuit trace that includes segments that are adjacent to each other and that have the same instantaneous current direction. By way of example, in some embodiments, an inductor that is included in any of the series inductor-capacitor circuits can be formed as a spiral trace on a printed wiring board.

Figure 8:
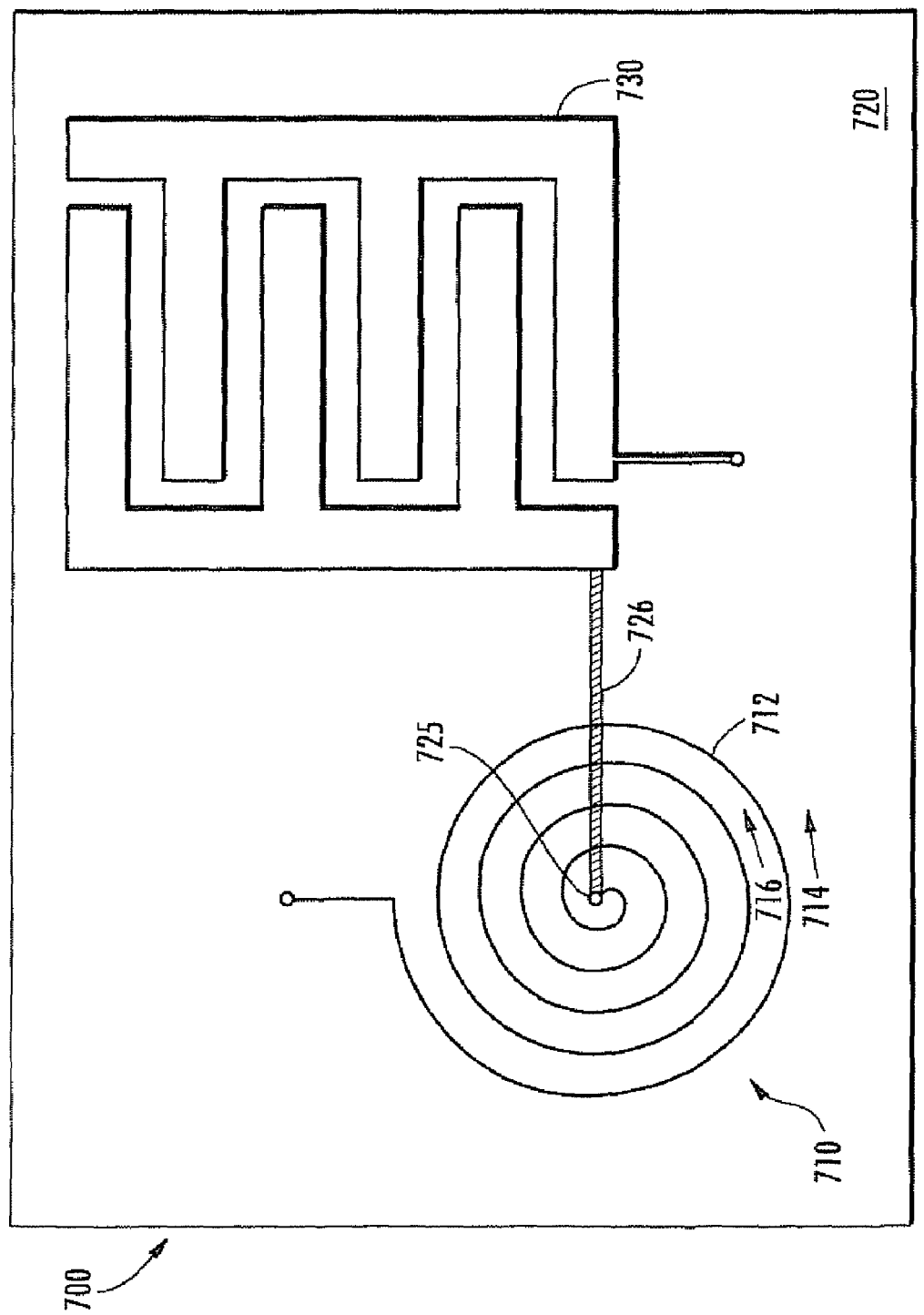
FIG. 8 illustrates a series inductor-capacitor circuit according to certain embodiments of the present invention.

FIG. 8 illustrates an implementation of a series inductor-capacitor circuit 700 according to certain embodiments of the present invention that includes an inductor 710 and a capacitor 730. As shown in FIG. 8, the inductor 710 is implemented as a spiral trace 712 on a printed wiring board 720. Typically, the spiral trace 712 is implemented on either the top or bottom surface of the printed wiring board 720, although, in some embodiments, the spiral trace 712 may be implemented on an interior layer of a multi-layer printed wiring board 720 since the amount of current carried through the spiral may be relatively small. As shown in FIG. 8, each turn of the spiral trace 712 is immediately adjacent to at least one additional turn of the spiral trace 712. It can also be seen via the arrows 714, 716 that the instantaneous current direction (and, thus the signal direction) in each turn of the spiral trace 712 is the same. The immediate adjacency of this arrangement causes self-coupling between adjacent turns of the spiral, which results in an increase in localized inductance so as to provide an inductor. It will be appreciated that the inductor 710 may be implemented using geometries other than the circular spiral shown in FIG. 8, such as, for example, an oval spiral, a square spiral, a rectangular spiral, a solenoid, other configurations which provide the adjacent traces with the same instantaneous current direction or by using discreet inductors.

As is also shown in FIG. 8, the capacitor 730 may be implemented as an inter-digitated finger capacitor (while the capacitor 730 appears in FIG. 8 to be on the same layer of the printed wiring board 720 as the inductor 710 in order to simplify the drawing, it will be appreciated that in this particular embodiment the spiral inductor 710 and the inter-digitated finger capacitor 730 are implemented on different layers of the printed wiring board 720). The inter-digitated finger capacitor 730 may be implemented as a co-planar arrangement of two closely spaced, inter-meshed metal combs. In some embodiments, multiple inter-digitated finger capacitors 730 may be stacked on adjacent layers of the printed wiring board 720 in order to provide increased capacitance. The inter-digitated finger capacitors may be located, for example, on interior layers of the printed wiring board 720. The capacitor 730 may be electrically connected to the inductor 710 through a conductive trace 726 residing on a layer of the printed wiring board 720 other than the layer on which the spiral trace 712 is residing and a conductive via 725 such as a metal plated through hole. In other embodiments, the inductors and/or capacitors may be implemented differently. For example, in some embodiments, the capacitor 730 may be implemented as a parallel plate capacitor where the plates of the capacitor are located on adjacent layers of the printed wiring board 720.

In some embodiments, the resonant frequency of the series inductor-capacitor circuits may be set to be about 1.1 to 2.5 times the highest operating frequency of interest. Thus, for example, for a communications connector that is to operate up to frequencies of 500 MHz, the resonant frequency of the series inductor-capacitor circuit may be set to, for example, 550 MHz to 1.25 GHz. In some embodiments, the two series inductor-capacitor circuits that share an inductor may have resonant frequencies that are within 25% of each other. The resonant frequency of a series inductor-capacitor circuit that includes both the shared inductor and a second inductor, such as the circuit 154 in FIG. 2 that includes capacitor 151 and inductors 152 and 136, may be determined as follows;

$$f_{res} = \frac{1}{2\pi\sqrt{(L_{152} + L_{136})C_{151}}} \quad (3)$$

where $L_{152}$ and $L_{136}$ correspond to the inductors 152 and 136, respectively, in FIG. 2, and $C_{151}$ corresponds to capacitor 151 in FIG. 2.

Figure 9:
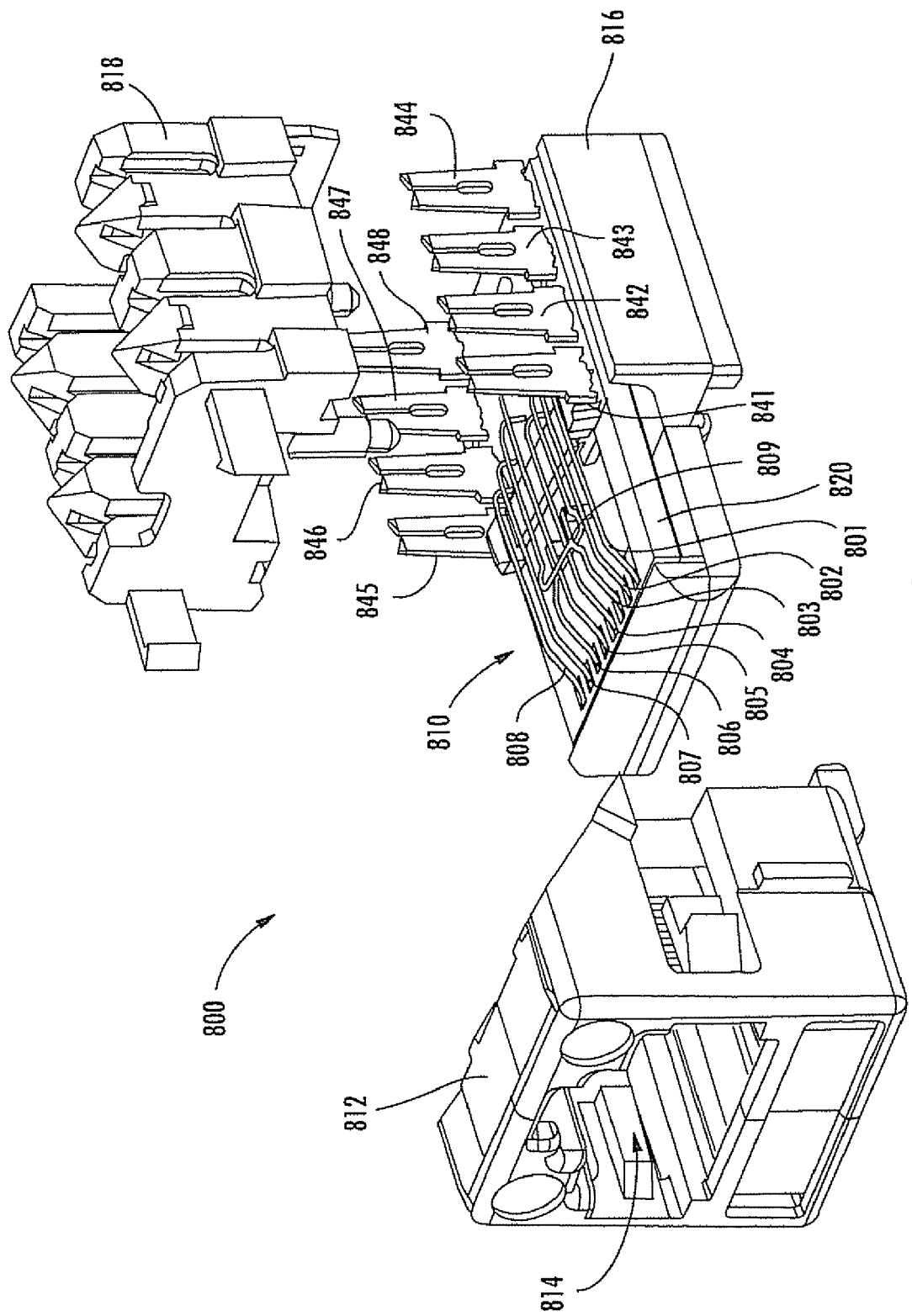
FIG. 9 is an exploded perspective view of a communications jack according to embodiments of the present invention.

FIGS. 9 and 10A-10F depict a communications connector 800 according to some embodiments of the present invention. The communications connector 800 depicted in FIGS. 9 and 10A-10F is a modular jack such as, for example, an RJ-45 style jack. As shown in FIG. 9, the jack 800 includes a jack frame or housing 812 having a plug aperture 814 for receiving a mating plug (not shown in FIG. 9), a cover 816 and a terminal housing 818. These components may be conventionally formed and need not be described in detail herein. For a further description of these components and the manner in which they interconnect, see, for example, U.S. Pat. No. 6,350,158 to Arnett et al. Those skilled in this art wilt recognize that other configurations of jack frames, covers and terminal housings may also be employed with the present invention.

As can also be seen in FIG. 9, the jack 800 further includes a communications insert 810. The communications insert 810 is received into an opening in the rear of the jack frame 812. A first surface of the communications insert 810 is protected by the cover 816, and a second surface of the communications insert 810 is covered and protected by the terminal housing 818. It will be appreciated that the jack 800 of FIGS. 9 and 10A-10F would typically be inverted to have the orientation shown in FIG. 1 when installed, as such an orientation can reduce buildup of dust and dirt on the jack contacts that may degrade the electrical connection between the plug blades and the jack contacts.

The communications insert 810 includes a wiring board 820, which may be formed of conventional materials. Specialized wiring boards such as, for example, flexible printed circuit boards could also be used. In the embodiment of the present invention depicted in FIGS. 9 and 10A-10F, the wiring board 820 comprises a substantially planar multi-layer printed wiring board. Eight contacts 801-808 are mounted on a top surface of the wiring board 820. The contacts 801-808 may comprise conventional contacts and may be shaped such as the contacts described in U.S. Pat. No. 7,204,722, the entire contents of which are incorporated herein by reference as if set forth fully herein.

Each of the contact wires 801-808 has a fixed portion that is mounted in the wiring board 820, and a distal end that terminates near a forward portion of the top surface of the printed wiring board 820 (the distal ends extend into slots in a mandrel and hence are not visible in FIG. 9). In this particular embodiment, the distal ends are "free" ends in that they are not mounted in the wiring board 820 or in another substrate, and hence can deflect when a plug is inserted into the jack 800. Each of the contacts 801-808 also includes a contact region that is located between the fixed portion and the distal end of the contact. The contact regions of the contacts 801-808 may be arranged in a generally side-by-side relationship, as is shown in FIG. 9. The jack 800 is configured so that each blade of a mating plug comes into contact with the contact region of a respective one of the contacts 801-808 when a plug is inserted into the plug aperture 814. Each of the contacts 801-808 extends into the plug aperture 814 to form physical and electrical contact with the blades of a mating plug (not shown).

The contact wires 801-808 are arranged in pairs defined by TIA 568B (see FIG. 1 and the discussion above). Accordingly, the contact regions of contacts 804, 805 (pair 1) are adjacent to each other and in the center of the sequence of contacts, the contact regions of contacts 801, 802 (pair 2) are adjacent to each other and occupy the rightmost two contact positions (from the vantage point of FIG. 9), the contact regions of contacts 807, 808 (pair 4) are adjacent to each other and occupy the leftmost two positions (from the vantage point of FIG. 9), and the contact regions of contacts 803, 806 (pair 3) are positioned between, respectively, pairs 1 and 2 and pairs 1 and 4. Note that these contact positions are consistent with the contact positions depicted in FIG. 1, as the jack 800 in FIG. 9 is depicted in an inverted orientation.

The contacts 801-808 may be mounted to the wiring board 820 via insertion into respective apertures 831-838 in the printed wiring board 820 (see FIGS. 1A-10F). These apertures 831-838 may comprise, for example, metal-plated holes. The contacts 801-808 may be interference fit within the apertures 831-838. Those skilled in this art will appreciate that contact wires 801-808 having other configurations may be used.

As can be seen in FIG. 9, contacts 803 and 806 (pair 3) include a "crossover" 809 in which the contacts cross each other without making electrical contact. The crossover 809 may be configured so that contacts 803 and 806 trade positions on opposite sides of the crossover such that the distal end of contact 803 is substantially longitudinally aligned with the fixed end of contact 806, and vice versa. The crossover 809 is located between the contact region where the contacts make physical and electrical contact with the blades of a mating plug and the fixed portion of the contacts that are mounted in the wiring board 820.

The crossover 809 provides compensatory inductive crosstalk. The presence of a crossover in the pair comprised of contacts 803 and 806, structural implementations thereof, and its effect on crosstalk are discussed in some detail in the aforementioned '722 patent. The crossover 809 provides the inductive component of crosstalk compensation for the pair 1-3, pair 2-3 and pair 3-4 pair combinations. It will be appreciated that techniques other than the crossover 809 may be used to provide first stage inductive crosstalk compensation such as, for example, crossovers in pairs other than the pair comprised of contacts 803 and 806 (such as, for example, those discussed in U.S. Pat. No. 6,350,158), the inclusion of discrete inductors or the provision of closely spaced traces on a printed wiring board that inductively couple with each other. It will also be appreciated that, in some embodiments, the first stage compensation for at least some pair combinations may be solely capacitive compensation.

As is also shown in FIG. 9, the communications insert 810 includes eight output terminals 841-848. In this particular embodiment, the output terminals 841-848 are implemented as insulation displacement contacts ("IDCs") that are inserted into eight respective IDC apertures 851-858 (see FIGS. 10A-10F). The IDCs 841-848 may be of conventional construction and need not be described in detail herein. Exemplary IDCs are illustrated and described in U.S. Pat. No. 5,975,919 to Arnett.

The wiring board 820 is a multi-layer wiring board, although in other embodiments of the present invention the wiring board 820 may comprise a single layer wiring board. It will also be appreciated that more than one wiring board may be included in the connector 800. FIGS. 10A-10F are top views of layers 1-6, respectively, of one particular wiring board 820 according to one particular embodiment of the present invention.

As shown in FIGS. 10A-10F, the printed wiring board 820 includes a plurality of conductive traces 821 (only a few of which are labeled in each figure) that electrically connect each of the contact apertures 831-838 to a respective one of the IDC apertures 851-858. The conductive traces 821 may be of conventional conductive materials such as, for example, copper, and are formed on the wiring board 820 via any method known to those skilled in this art to be suitable for the application of conductive traces. As shown in FIGS. 10A-10F, in most cases a plurality of conductive traces 821 that reside on multiple layers of the wiring board 820 are used to connect one of the contact apertures 831-838 to its respective IDC aperture 851-858, and metal-plated holes or other layer-transferring structures known to those skilled in this art (shown as small circles in FIGS. 10A-10F) are used to electrically connect these conductive traces to provide a continuous conductive path. The conductive traces 821 are implemented on multiple layers of the wiring board 820 to permit the conductive paths that connect contact apertures to respective IDC apertures to cross one another without making electrical contact.

The wiring board 820 further includes a plurality of crosstalk compensation elements that are used to provide crosstalk compensation between various pair combinations. In this particular embodiment, multi-stage crosstalk compensation is provided with respect to the pair 1-3, pair 2-3, pair 3-4 and pair 1-4 pair combinations.

In particular, as shown in FIGS. 10B through 10E, first and second pairs of inter-digitated finger capacitors 860a, 860b and 861a, 861b are provided on the wiring board 820 to implement the capacitive component of the first stage of a multi-stage crosstalk compensation circuit for the pair 1-3 pair combination. As noted above, the inductive component of the first stage of a multi-stage crosstalk compensation circuit for the pair 1-3 pair combination is provided by the crossover 809 in the contact wires 801-808. The first capacitor 860a of the first pair of inter-digitated finger capacitors is on layer 2 of the wiring board 820 (see FIG. 10B) and the second capacitor 860b of the first pair is provided on layer 4 of the wiring board 820 (see FIG. 10D). The first capacitor 861a of the second pair of inter-digitated finger capacitors is on layer 3 of the wiring board 820 (see FIG. 10C) and the second capacitor 861b of the second pair is provided on layer 5 of the wiring board 820 (see FIG. 10E). Another capacitor 860c is provided on layer 5 of the wiring board 820 that provides additional first stage crosstalk compensation for the pair 1-3 pair combination.

Figure 10A:
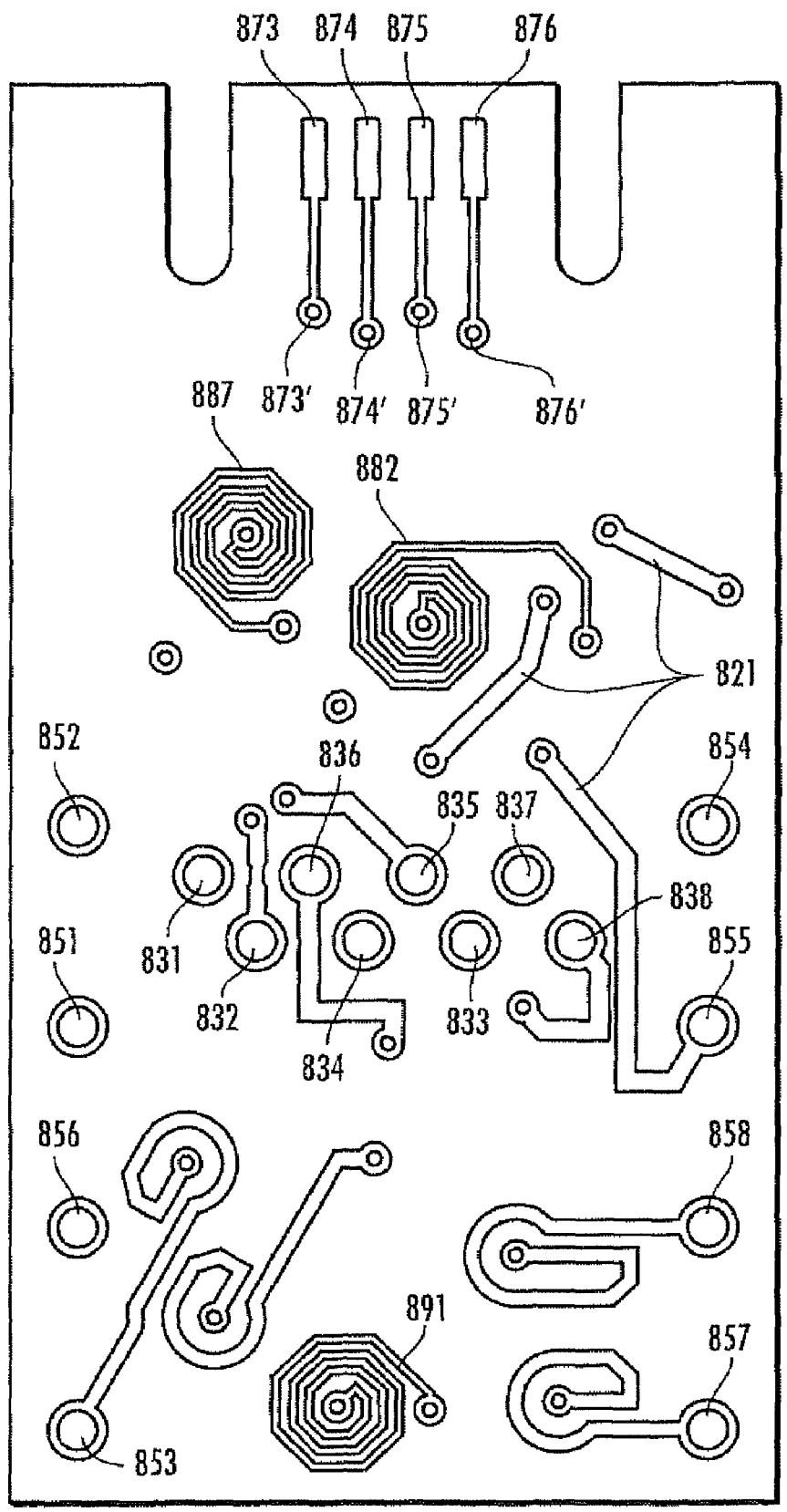
FIGS. 10A-10F are plan views of the six layers of the printed wiring board of the communications jack of FIG. 9.
Figure 10B:
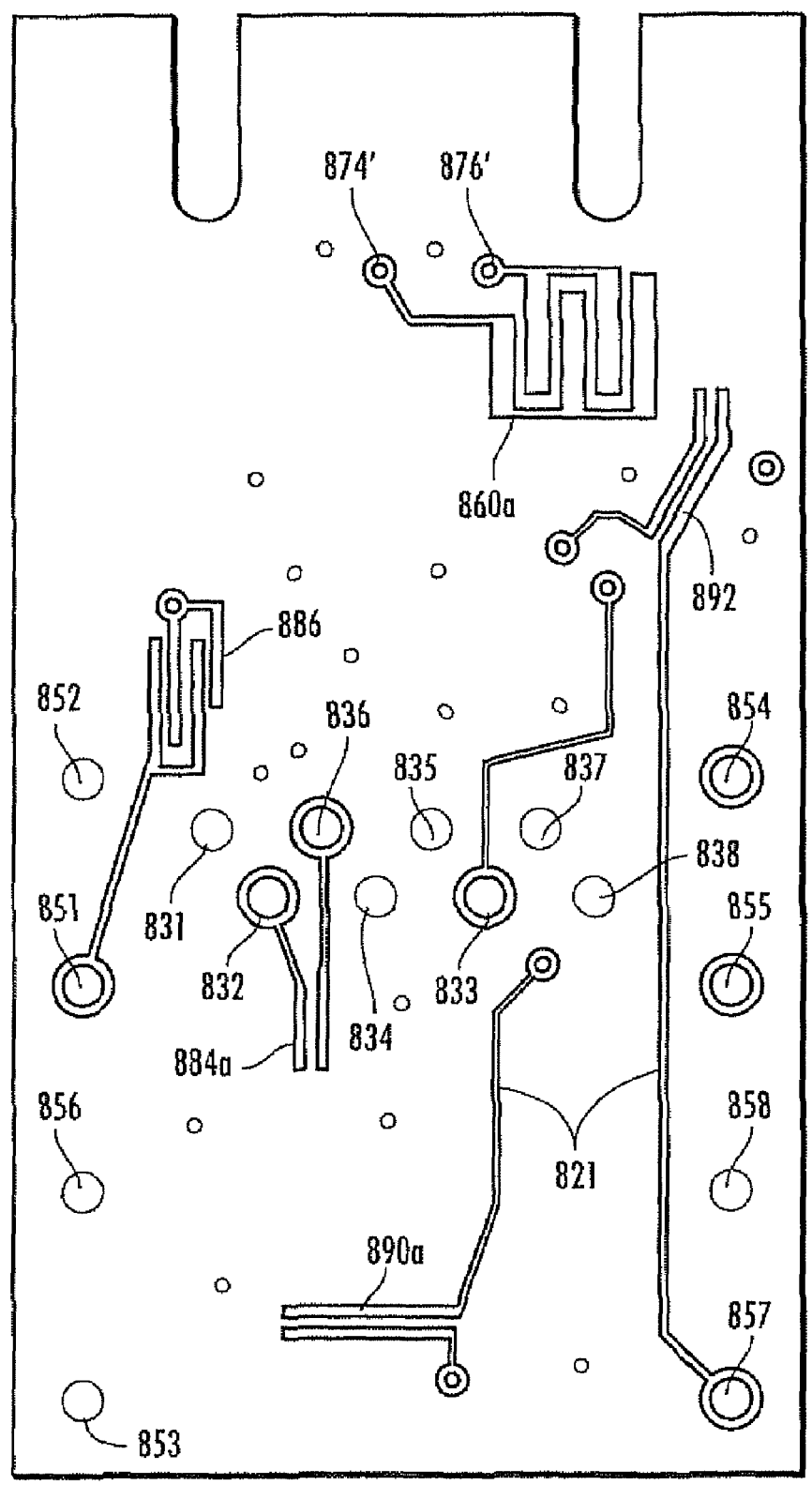
Figure 10C:
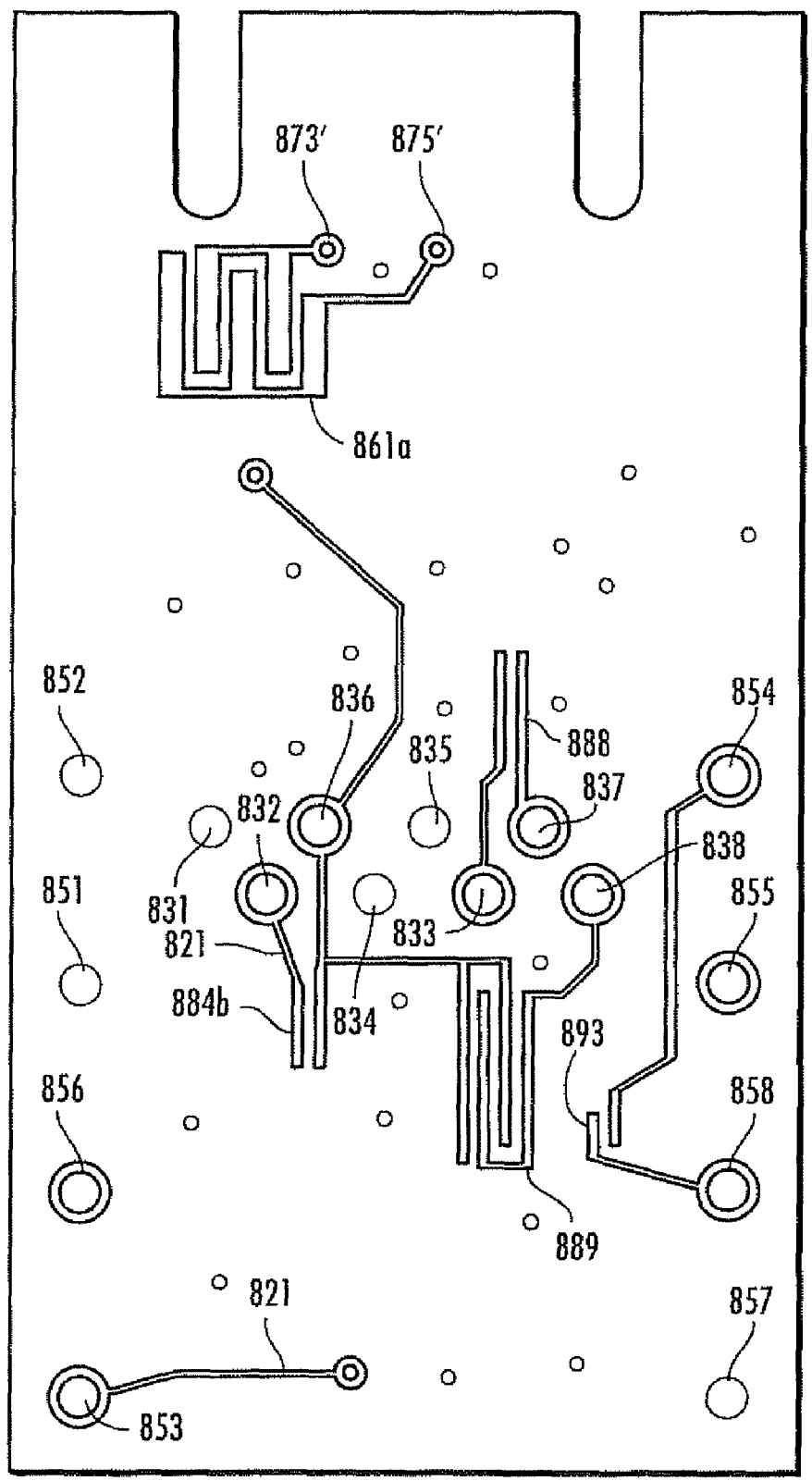
Figure 10D:
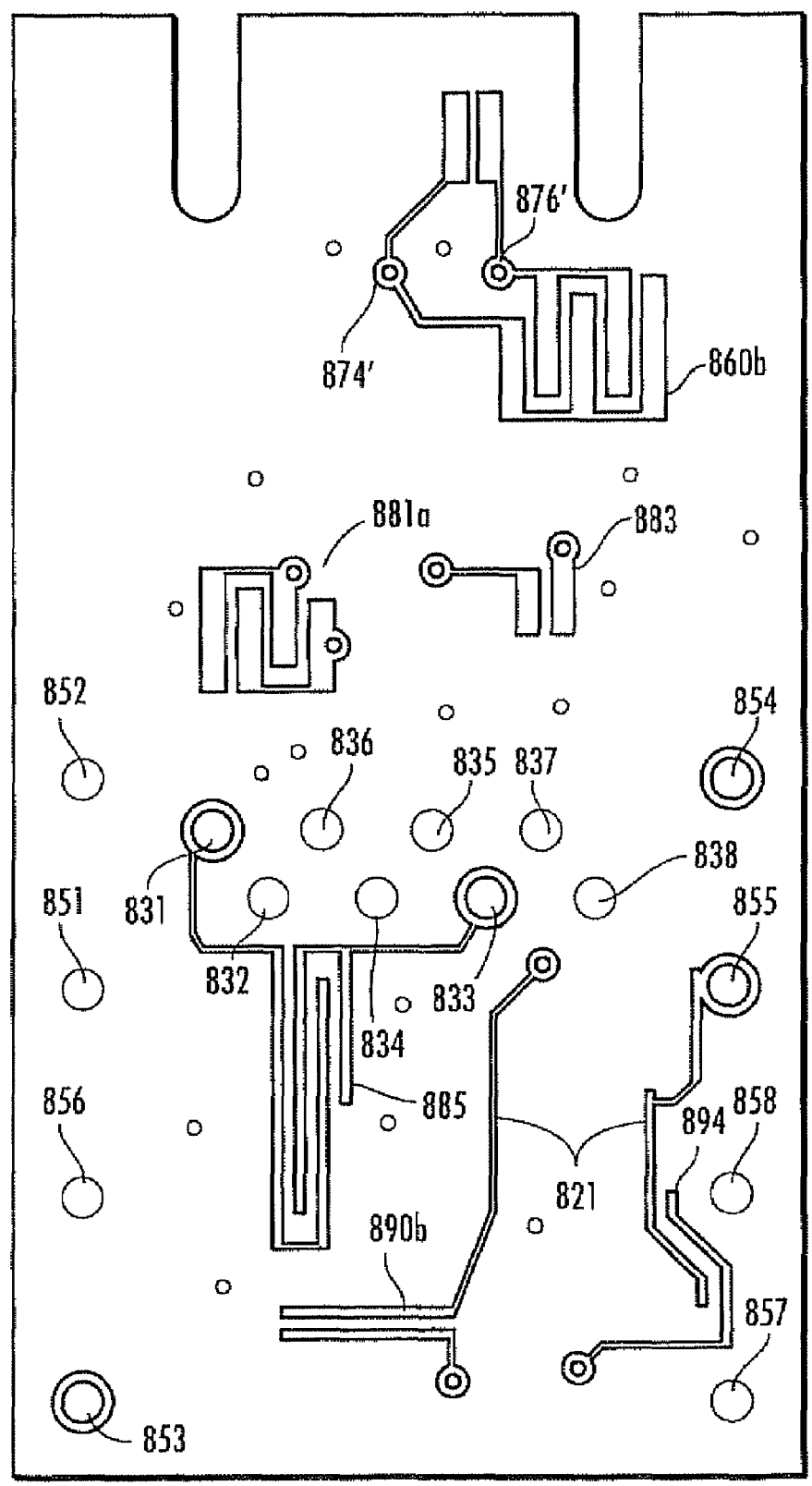
Figure 10E:
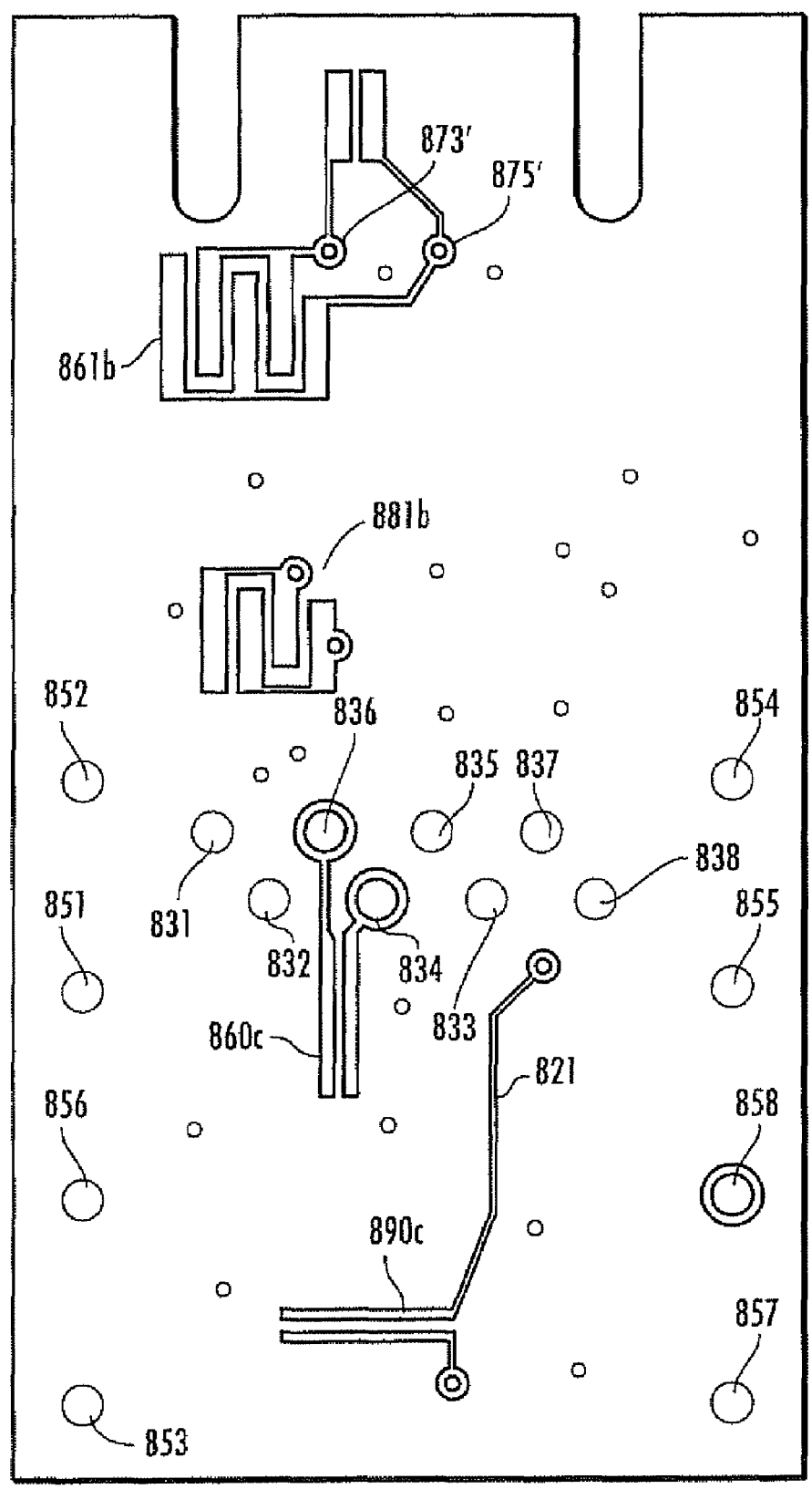
Figure 10F:
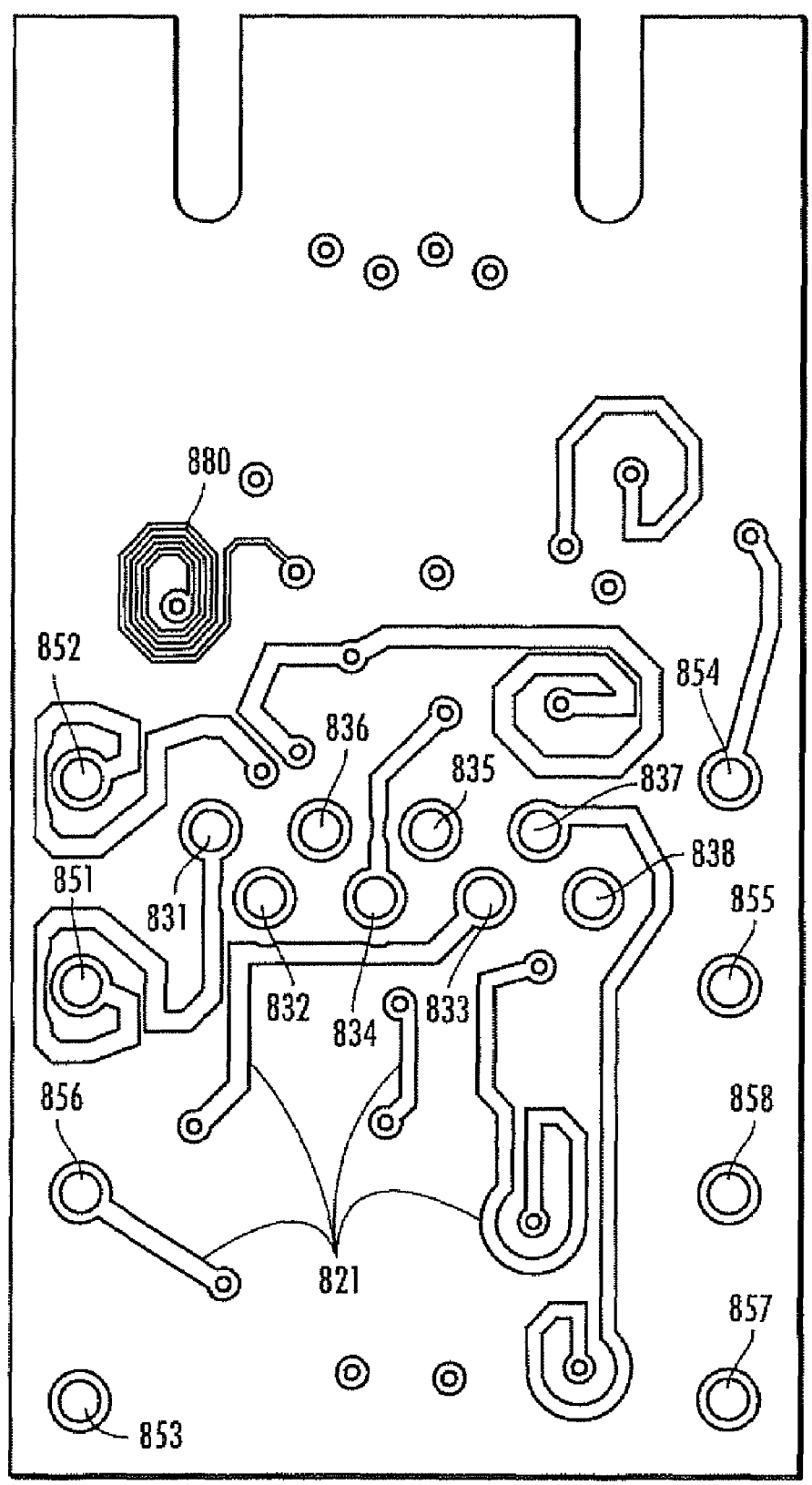

The modular jack 800 is designed to mate with a modular plug (not shown in the figures). As shown in FIG. 10A, the wiring board 820 includes a plurality of contact pads 873-876 that are located near the forward edge of the top surface of the wiring board 820. As the plug mates with the contacts 801-808, either the blades and/or the housing of the plug force the distal ends of the contacts 801-808 to deflect downwardly toward the top surface of the wiring board 820. As a result of this deflection, a portion of the distal end of each of contacts 803-806 comes into direct and electrical contact with its respective contact pad 873-876. The contact pads 873-876 may comprise any conductive element that mates with its respective contact so as to electrically connect the contact to one or more conductive traces, plated-through holes or other elements on the wiring board 820. The contact pads may, for example, comprise immersion tin plated copper pads, small gold plated nail heads, carbon ink pads, etc.

The electrodes of each of the first pair of capacitors 860a, 860b are electrically connected to the contact pads 874 and 876, respectively, through metal plated holes 874' and 876' in order to capacitively couple energy from contact wire 804 to contact wire 806 and vice versa. The electrodes of each of the second pair of capacitors 861a, 861b are electrically connected to the contact pads 873 and 875, respectively, through metal plated holes 873' and 875' in order to capacitively couple energy from contact wire 803 to contact wire 805 and vice versa.

First and second series inductor-capacitor circuits are also provided on the wiring board 820 that implement the second stage of a multi-stage crosstalk compensation circuit for the pair 1-3 pair combination. The first series inductor-capacitor circuit comprises a spiral inductor 887 on wiring board layer 1 (see FIG. 10A) and a pair of inter-digitated finger capacitors 881a and 881b on wiring board layers 4 and 5 (see FIGS. 10D and 10E). This first series inductor-capacitor circuit 887, 881a, 881b provides second stage compensation between the conductive path on the wiring board that is attached to contact wire 805 and the conductive path on the wiring board that is attached to contact wire 806. The second series inductor-capacitor circuit comprises a spiral inductor 882 on wiring board layer 1 (see FIG. 10A) and an inter-digitated finger capacitor 883 on wiring board layer 4 (see FIG. 10D). This second series inductor-capacitor circuit 882, 883 provides second stage compensation between the conductive path on the wiring board that is attached to contact wire 803 and the conductive path on the wiring board that is attached to contact wire 804.

As noted above, multi-stage crosstalk compensation is provided with respect to the pair 2-3 and pair 3-4 pair combinations as well. For the pair 2-3 pair combination, the first compensation stage comprises inductive compensation that is provided in the contact wires after the crossover 809 where contact wires 806 and 802 inductively couple. The first compensation stage further includes a pair of inter-digitated finger capacitors 884a, 884b that are provided on layers 2 and 3 of the wiring board 820 (see FIGS. 10B-10C), respectively, that provide capacitive coupling between the conductive path on the wiring board that is attached to contact wire 802 and the conductive path on the wiring board that is attached to contact wire 806. The first compensation stage further includes a third inter-digitated finger capacitor 885 that is provided on wiring board layer 4 (see FIG. 10D) that provides capacitive coupling between the conductive path on the wiring board that is attached to contact wire 801 and the conductive path on the wiring board that is attached to contact wire 803. A series inductor-capacitor circuit is also provided on the wiring board 820 that implements the second stage of a multi-stage crosstalk compensation circuit for the pair 2-3 pair combination. This series inductor-capacitor circuit comprises an inter-digitated finger capacitor 886 on wiring board layer 2 (see FIG. 10B), a spiral inductor 880 on wiring board layer 6 (see FIG. 10F) and the spiral inductor 887. Thus, the second stage compensation for the pair 2-3 pair compensation shares the inductor 887 with the second stage compensation for the pair 1-3 pair compensation in the manner that is discussed above with respect to FIG. 2.

The multi-stage crosstalk compensation for the pair 3-4 pair combination includes a first compensation stage that comprises inductive compensation that is provided in the contact wires after the crossover 809 where contact wires 803 and 807 inductively couple. This first compensation stage further includes an inter-digitated finger capacitor 888 that is provided on wiring board layer 3 (see FIG. 10C) that provides capacitive coupling between the conductive path on the wiring board that is attached to contact wire 803 and the conductive path on the wiring board that is attached to contact wire 807, and an inter-digitated finger capacitor 889 that is also provided on wiring board layer 3 that provides capacitive coupling between the conductive path on the wiring board that is attached to contact wire 806 and the conductive path on the wiring board that is attached to contact wire 808. A series inductor-capacitor circuit is also provided on the wiring board 820 that implements the second stage of a multi-stage crosstalk compensation circuit for the pair 3-4 pair combination. This series inductor-capacitor circuit comprises a set of three inter-digitated finger capacitors 890a, 890b, 890c on wiring board layers 2, 4 and 5 (see FIGS. 10B, 10D and 10E), respectively, and a spiral inductor 891 on wiring board layer 1 that provide second stage compensation between the conductive path on the wiring board that is attached to contact wire 803 and the conductive path on the wiring board that is attached to contact wire 808.

Finally, the printed wiring board 820 also includes inter-digitated finger capacitors 892, 893 and 894 on wiring board layers 2, 3 and 4, respectively that provide multi-stage crosstalk compensation for the pair 1-4 pair combination.

The use of the series inductor-capacitor circuits for the second stage compensation can improve performance at high frequencies if a mating plug is a low crosstalk plug, and can improve performance at low frequencies if the mating plug is a high crosstalk plug. An explanation on how this works is as follows.

The "offending" crosstalk that arises in the connector 800 is attributed to two factors: capacitive coupling and inductive coupling, which are primarily introduced in a mating plug and in the plug contact region of the contacts 801-808 due to the non-optimum standardized configuration for connector contact wires. To reduce or compensate for this crosstalk, two stages of crosstalk compensation are provided for various of the pair combinations. In each case the first crosstalk compensation stage has a polarity that is opposite of the polarity of the crosstalk introduced in the mating plug and in the plug contact region of the connector 800, whereas the second crosstalk compensation stage has a polarity that is the same as the polarity of the crosstalk introduced in the mating plug and in the plug contact region of the connector 800, as is described in detail in the aforementioned '358 patent. It should be noted that the first stage and/or the second stage may have multiple sub-stages.

While connector 800 provides both inductive and capacitive first stage crosstalk compensation, the inductive and capacitive first stage compensation provide effective normalized compensation level that is relatively flat with frequency. In contrast, the second stage capacitive normalized compensation level is designed to increase with frequency due to the inclusion of the series inductor-capacitor circuits. As a result, the net normalized compensation crosstalk level of the connector, which is comprised of the first stage compensation crosstalk minus the second stage compensation crosstalk, declines with increasing frequency, thereby providing a lower-level of normalized compensation crosstalk at a high frequency than would normally exist without the series inductor in place. This minimizes crosstalk over-compensation in the connector at high frequencies when the mating plug is a low crosstalk plug. In contrast, when the frequency is sufficiently low, the normalized compensation crosstalk level is relatively flat, thus minimizing crosstalk under-compensation at low frequencies in the connector when the mating plug is a high crosstalk plug.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A communications connector, comprising:
   a plurality of conductive paths, each of which connects a respective one of a plurality of input terminals to a respective one of a plurality of output terminals, wherein each of the conductive paths is paired with another of the conductive paths, and each of the pairs are configured to transmit a differential signal through the connector;
   a first capacitor and a first inductor coupled in series between a first conductive path of a first of the differential pairs and a first conductive path of a second of the differential pairs to provide a first series inductor-capacitor circuit between the first conductive path of the first of the differential pairs and the first conductive path of the second of the differential pairs; and
   a second capacitor coupled between a first conductive path of a third of the differential pairs and a first node that is located between the first capacitor and the first inductor to provide a second series inductor-capacitor circuit between the first conductive path of the third of the differential pairs and the first conductive path of the second of the differential pairs.

2. The communications connector of claim 1, further comprising a second inductor disposed in series between the second capacitor and the first node that is part of the second series inductor-capacitor circuit.

3. The communications connector of claim 2, further comprising a crosstalk compensation circuit between the first of the differential pairs and the third of the differential pairs that is designed to at least partly compensate for crosstalk that passes between the first of the differential pairs and the third of the differential pairs via the first capacitor, the second capacitor and the second inductor.

4. The communications connector of claim 2, wherein the communications connector comprises a communications jack, wherein the conductive paths are aligned in a generally side-by-side array in a plug-jack mating region of the connector, and wherein one of the conductive paths of the third differential pair is on the outside of the array in the plug-jack mating region.

5. The communications connector of claim 2, wherein a capacitance of the first capacitor exceeds a capacitance of the second capacitor by at least fifty percent.

6. The communications connector of claim 2, wherein the resonant frequency of the first series inductor-capacitor circuit is within 25% of the resonant frequency of the second series inductor-capacitor circuit.

7. A communications connector, comprising:
a first input terminal, a first output terminal, and a first conductive path extending from the first input terminal to the first output terminal;
a second input terminal, a second output terminal, and a second conductive path extending from the second input terminal to the second output terminal;
a third input terminal, a third output terminal, and a third conductive path extending from the third input terminal to the third output terminal;
a fourth input terminal, a fourth output terminal, and a fourth conductive path extending from the fourth input terminal to the fourth output terminal;
a fifth input terminal, a fifth output terminal, and a fifth conductive path extending from the fifth input terminal to the fifth output terminal;
a sixth input terminal, a sixth output terminal, and a sixth conductive path extending from the sixth input terminal to the sixth output terminal;
a seventh input terminal, a seventh output terminal, and a seventh conductive path extending from the seventh input terminal to the seventh output terminal;
an eighth input terminal, an eighth output terminal, and an eighth conductive path extending from the eighth input terminal to the eighth output terminal;
a first capacitor and a first inductor coupled in series between one of the fourth or fifth conductive paths and one of the third or sixth conductive paths;
a second capacitor coupled between one of the first, second, seventh or eighth conductive paths and a node located between the first capacitor and the first inductor;
wherein the fourth and fifth conductive paths comprise a first differential pair of conductive paths;
wherein the first and second conductive paths comprise a second differential pair of conductive paths;
wherein the third and sixth conductive paths comprise a third differential pair of conductive paths; and
wherein the seventh and eighth conductive paths comprise a fourth differential pair of conductive paths.

8. The communications connector of claim 7, further comprising a second inductor disposed in series between the second capacitor and a node located between the first capacitor and the first inductor.

9. The communications connector of claim 7, wherein the first capacitor and the first inductor comprise a first series inductor-capacitor circuit and wherein the second capacitor, the second inductor and the first inductor comprise a second series inductor-capacitor circuit.

10. The communications connector of claim 7, wherein the first through eighth conductive paths are aligned in numerical order in a substantially side-by-side relationship in a plug jack mating region of the connector.

11. The communications connector of claim 7, wherein a capacitance of the first capacitor exceeds a capacitance of the second capacitor by at least fifty percent.

12. A communications connector, comprising:
a housing;
a printed wiring board that is mounted at least partially within the housing, the printed wiring board having at least first through third input terminals and first through third output terminals;
a first conductive path that connects the first input terminal to the first output terminal;
a second conductive path that connects the second input terminal to the second output terminal;
a third conductive path that connects the third input terminal to the third output terminal;
a first inductor and a first capacitor coupled between the first conductive path and the second conductive path, where the first inductor and the first capacitor are arranged in series to provide a first series inductor-capacitor circuit; and
a second capacitor coupled between the third conductive path and the second conductive path through the first inductor.

13. The communications connector of claim 12, further comprising a second inductor that is coupled between the second capacitor and the first inductor.

14. The communications connector of claim 13, wherein the second capacitor, the second inductor and the first inductor form a second series inductor-capacitor circuit.

15. The communications connector of claim 14, wherein a resonant frequency of at least one of the first and second series inductor-capacitor circuits is set in the range of about 750 MHz to about 1000 MHz.

16. The communications connector of claim 13, wherein at least one of the first inductor or the second inductor comprises a conductive trace that is on and/or within the printed wiring board that includes self-coupling segments that are immediately adjacent to each other and that have the same instantaneous current direction.

17. The communications connector of claim 16, wherein the self coupling segments comprise a portion of the conductive path that has a spiral shape.

18. The communications connector of claim 12, further comprising:
a fourth conductive path that together with the second conductive path forms a differential pair of conductive paths for carrying a differential signal; and
a crosstalk compensation circuit between the first conductive path and the fourth conductive path that generates crosstalk having a first polarity;
wherein the first polarity is generally opposite the polarity of the crosstalk generated by the first series inductor-capacitor circuit.

19. The communications connector of claim 13, wherein a capacitance of the first capacitor exceeds a capacitance of the second capacitor by at least fifty percent.

20. The communications connector of claim 14, wherein the resonant frequency of the first series inductor-capacitor circuit is within 25% of the resonant frequency of the second series inductor-capacitor circuit.

* * * * *